(12) United States Patent
Wang et al.

(10) Patent No.: US 12,740,369 B2
(45) Date of Patent: Sep. 15, 2026

(54) FLIPPING APPARATUS

(71) Applicant: ACM RESEARCH (SHANGHAI), INC., Shanghai (CN)

(72) Inventors: He Wang, Shanghai (CN); Yazhou Li, Shanghai (CN); Shena Jia, Shanghai (CN); Xiaofeng Tao, Shanghai (CN); Hui Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 269 days.

(21) Appl. No.: 18/579,151

(22) PCT Filed: Jun. 17, 2022

(86) PCT No.: PCT/CN2022/099497
§ 371 (c)(1),
(2) Date: Jan. 12, 2024

(87) PCT Pub. No.: WO2023/284484
PCT Pub. Date: Jan. 19, 2023

(65) Prior Publication Data

US 2024/0347361 A1 Oct. 17, 2024

(30) Foreign Application Priority Data

Jul. 13, 2021 (CN) ......................... 202110790558.4

(51) Int. Cl.
*H10P 72/30* (2026.01)
*H10P 72/00* (2026.01)
(Continued)

(52) U.S. Cl.
CPC ...... *H10P 72/3211* (2026.01); *H10P 72/0414* (2026.01); *H10P 72/50* (2026.01);
(Continued)

(58) Field of Classification Search
CPC ......... H01L 21/67017; H01L 21/67023; H01L 21/67028; H01L 21/67034; H01L 21/6704;
(Continued)

(56) References Cited

U.S. PATENT DOCUMENTS 9,921,570 B2 * 3/2018 Hirato ............... H01L 21/67781
10,395,962 B2 * 8/2019 Miyamoto ........ H01L 21/67313
(Continued)

FOREIGN PATENT DOCUMENTS

CN 103052574 A 4/2013
CN 104813438 A 7/2015
(Continued)

OTHER PUBLICATIONS

International Search Report issued in Application No. PCT/CN2022/099497 mailed on Sep. 2, 2022 (5 pages).
(Continued)

*Primary Examiner* — Saul Rodriguez
*Assistant Examiner* — Brendan P Tighe
(74) *Attorney, Agent, or Firm* — Osha Bergman Watanabe & Burton LLP

(57) ABSTRACT

Provided in the present invention is a flipping apparatus, comprising a bracket body, a rotary driver, and a clamping apparatus, a plurality of partition plates being formed on inner side surfaces of two side walls of the bracket body, a carrier slot for the placement of a wafer being formed between each two adjacent partition plates, and rotating shafts being formed on outer side surfaces of the two side walls of the bracket body. The rotary driver is connected to at least one rotating shaft to drive the bracket body to rotate, and the clamping apparatus is disposed on the side wall of the bracket body and is used for pressing or releasing the wafers placed in the carrier slots. In the present invention, by
(Continued)

means of the arrangement of the clamping apparatus on the bracket body holding the wafers, the wafers are fixed by the clamping apparatus when the bracket body rotates, effectively avoiding fragments or surface scratches caused by the wafers shaking in the bracket body when the wafers changes posture with the bracket body.

13 Claims, 24 Drawing Sheets

(51) Int. Cl.
*H10P 72/50* (2026.01)
*H10P 72/76* (2026.01)

(52) U.S. Cl.
CPC ...... *H10P 72/7606* (2026.01); *H10P 72/7612* (2026.01); *H10P 72/7624* (2026.01)

(58) Field of Classification Search
CPC ............. H01L 21/67051; H01L 21/673; H01L 21/6732; H01L 21/67718; H01L 21/68721
See application file for complete search history.

(56) References Cited

U.S. PATENT DOCUMENTS

2004/0045865 A1 3/2004 Jun et al.
2006/0137726 A1* 6/2006 Sano ................ H01L 21/67028 118/696
2008/0156351 A1* 7/2008 Mitsuyoshi ....... H01L 21/67201 134/137
2008/0156357 A1* 7/2008 Mitsuyoshi ....... H01L 21/67718 134/133
2008/0199283 A1* 8/2008 Mitsuyoshi ....... H01L 21/67201 414/222.01
2008/0216880 A1* 9/2008 Shiomi ............ H01L 21/67781 134/133
2009/0010748 A1* 1/2009 Kamikawa ........ H01L 21/67763 414/796.4
2009/0252578 A1* 10/2009 Machida ........... H01L 21/67745 901/14
2010/0068014 A1* 3/2010 Mitsuyoshi ....... H01L 21/68707 414/226.04
2012/0016516 A1* 1/2012 Machida ........... H01L 21/67754 700/218
2013/0180551 A1* 7/2013 Mitsuyoshi ............... B08B 1/20 134/61
2015/0131088 A1* 5/2015 Shinohara ......... H01L 21/67046 414/758
2015/0139760 A1* 5/2015 Okada .............. H01L 21/67781 414/800
2016/0221045 A1* 8/2016 Kato ................ H01L 21/67781
2017/0282210 A1* 10/2017 Okutani ............ H01L 21/68728
2018/0090356 A1* 3/2018 Miyamoto ........ H01L 21/68707
2018/0090358 A1* 3/2018 Miyamoto ........ H01L 21/67288
2018/0090360 A1* 3/2018 Miyamoto .............. H01L 21/68
2019/0273003 A1 9/2019 Wang et al.
2021/0249257 A1* 8/2021 Wang ................ H01L 21/67781

FOREIGN PATENT DOCUMENTS

CN 206040607 U 3/2017
CN 111276436 A 6/2020
CN 111451902 A 7/2020
CN 111599735 A 8/2020
CN 112470252 A 3/2021
JP H04160161 A 6/1992
JP 2001156163 A 6/2001
JP 2004327674 A 11/2004
JP 2011119348 A 6/2011
JP 2011222696 A 11/2011
JP 2018046272 A 3/2018
JP 2018163898 A 10/2018
KR 20210018854 A 2/2021
KR 20210075935 A 6/2021
WO 2019232741 A1 12/2019

OTHER PUBLICATIONS

Written Opinion issued in Application No. PCT/CN2022/099497 mailed on Sep. 2, 2022 (3 pages).
Office Action issued in Japanese patent application No. 2024-501877, mailed on Feb. 24, 2026 (6 pages).
Office Action issued in corresponding TW Application No. 111126351 dated Nov. 18, 2025 (8 pages).
Office Action issued in corresponding KR Application No. 20247003994 dated Feb. 3, 2026 (5 pages).
Office Action issued in corresponding SG Application No. 11202400233X dated Feb. 3, 2026 (12 pages).

* cited by examiner

FLIPPING APPARATUS

BACKGROUND OF THE INVENTION

1. Field of the Invention

The present invention relates to a flipping apparatus.

2. The Related Art

In the manufacturing of semiconductor devices, a plurality of different processes are involved, and different processes have different placement postures for wafers to achieve their respective processing purposes. For example, with the continuous reduction of semiconductor process linewidth, the requirements for wafer surface cleanliness are higher and higher, and in order to balance the wafer surface cleaning effect and efficiency, technicians have developed a batch cleaning and single cleaning combination cleaning equipment, that is, a batch cleaning apparatus and a single cleaning apparatus are integrated in the same equipment. It is well known that in the batch cleaning apparatus, wafers are immersed in a cleaning tank in a vertical posture for the cleaning process, while in the single cleaning apparatus, the wafer is held in a horizontal posture for the cleaning process. Because most robots only have a grasping function, and can easily grasp the wafer in the vertical or horizontal posture, but cannot realize a flipping function, if the robot is configured with the flipping function, the complexity of the structure and operation of the robot will be increased, so a flipping apparatus is usually arranged in the wafer transfer process of different postures, and as an intermediate platform, the flipping apparatus can change the placement posture of the wafer to adapt to different processes and facilitate the transfer of the robot.

Referring to FIG. 1, a robot 101 grasps wafers 103 after the end of the previous process and transfers the wafers 103 to a wafer holder 111 of a flipping mechanism 110. The flipping mechanism 110 further includes an accommodating cavity 113 and a driver 115. The wafer holder 111 is installed in the accommodating cavity 113, and the driver 115 drives the wafer holder 111 to rotate in the accommodating cavity 113, so that the wafer 103 held in the wafer holder 111 is converted from a vertical posture to a horizontal posture. Then, another robot 102 extends through a loading opening 114 disposed on the accommodating cavity 113, and takes out the wafer 103 from the flipping mechanism 110 in a horizontal posture and transfers it to the next process, referring to FIG. 2.

Referring to FIG. 3, the wafer holder 111 is provided with one or more groups of carrier slots 112 for accommodating one or more than two wafers 103. To facilitate loading and taking out the wafer 103, the width of the carrier slots 112 is set to be larger than the thickness of the wafer 103, and generally, the width is about 4 mm, and the thickness of the wafer 103 is about 0.7 mm. When the wafer rotates from the vertical posture to the horizontal posture, because the thickness of the wafer is less than the width of the carrier slots 112, during the rotation process, the wafer will shake in the carrier slots 112 under the action of its own gravity (referring to the direction indicated by the arrow in FIG. 3), resulting in scratches on the surface of the wafer, and even resulting in fragments.

SUMMARY

An object of the present invention is to provide a flipping apparatus capable of solving the problem that scratches or fragments caused by wafer shake while the wafer changes its posture during the wafer transfer in a batch cleaning and single cleaning combination cleaning equipment.

To achieve the above and other related objects, the present invention discloses a flipping apparatus, comprising:

- a bracket body, wherein a plurality of partition plates are formed on inner side surfaces of two side walls of the bracket body, carrier slots for placing wafers are formed between adjacent partition plates, and rotating shafts are formed on outer side surfaces of the two side walls of the bracket body;
- a rotary driver, wherein the rotary driver is connected to at least one rotating shaft to drive the bracket body to rotate;
- a clamping apparatus, wherein the clamping apparatus is disposed on the side wall of the bracket body and is used to press or release the wafers placed in the carrier slots.

Preferably, in the flipping apparatus, the clamping apparatus comprises:

- a housing, wherein the housing is fixed on the side wall of the bracket body;
- a gas port, wherein the gas port is located at one end of the housing, and used to connect to a gas source;
- a piston, wherein the piston is slidably arranged in the housing and is provided with driving force by the gas source;
- a telescopic rod, wherein the telescopic rod is slidably arranged in the housing, and one end of the telescopic rod is fixedly connected with the piston;
- a reset spring, wherein the reset spring is arranged at the other end of the housing and connected with the other end of the telescopic rod for resetting the piston and the telescopic rod;
- a plurality of limiting slots, wherein the plurality of limiting slots are arranged on one side of the housing and are arranged at equal intervals along the length direction of the telescopic rod;
- a plurality of limiting rods, wherein one end of the plurality of limiting rods is fixed on the telescopic rod, the other end of the plurality of limiting rods passes through corresponding limiting slot, and the limiting rods are driven by the telescopic rod to slide in the limiting slots to press or release the wafers placed in the carrier slots.

Preferably, in the flipping apparatus, the clamping apparatus further includes a liquid discharge chamber for collecting and discharging liquid accumulated inside the housing.

Preferably, in the flipping apparatus, the clamping apparatus is further provided with a displacement sensor for measuring the displacement of the telescopic rod.

Preferably, in the flipping apparatus, accommodating grooves for accommodating the limiting rods are disposed on the partition plates of the bracket body.

Preferably, in the flipping apparatus, a plurality of liquid drain holes are disposed at the bottom of the carrier slot of the bracket body.

Preferably, the flipping apparatus further comprises a box body, wherein the box body is provided with a loading port.

Preferably, the flipping apparatus further comprises an exhaust device disposed on a rear wall of the box body, wherein the exhaust device comprises a first exhaust plate, a second exhaust plate, a liquid collecting cavity and an exhaust port which are sequentially arranged along the air flow direction, and the first exhaust plate is provided with a plurality of first air vents; the second exhaust plate is provided with a plurality of second air vents, a space is reserved between the first exhaust plate and the second exhaust plate, the first air vents and the second air vents are arranged in a staggered manner, and the exhaust port is configured to connect a fan.

Preferably, in the flipping apparatus, both the second air vents and the exhaust port are arranged obliquely upward.

Preferably, in the flipping apparatus, the first exhaust plate is arranged in an inclined manner relative to the second exhaust plate.

Preferably, in the flipping apparatus, the bottom of the liquid collecting cavity is provided with a liquid discharge port.

Preferably, the flipping apparatus further comprises a lifting mechanism, wherein the lifting mechanism comprises a lifting rod and a support base fixed on the lifting rod, the support base is driven by the lifting rod to move up and down, and is used to assist the wafers to be transferred from a robot to the bracket body.

Preferably, the flipping apparatus further comprising a plurality of nozzles disposed around the bracket body for spraying liquid onto the wafer held in the bracket body.

As described above, the flipping apparatus provided by the present invention has the following beneficial effects:

in the present invention, a clamping apparatus is disposed on a bracket body for holding a wafer, and the wafer is fixed by the clamping apparatus when the bracket body rotates, so that the wafer can effectively avoid shaking when the wafer changes posture with the bracket body. Therefore, there are no fragments or wafer surface scratches when the wafer changes posture with the bracket body.

BRIEF DESCRIPTION OF THE DRAWINGS

The features and properties of the present invention are further described by the following embodiments and accompanying drawings.

DETAILED DESCRIPTION OF EMBODIMENTS

The following will describe the embodiments of the present invention through specific examples, and persons skilled in the art can easily understand other advantages and functions of the present invention from the contents disclosed in this specification. The present invention may also be embodied or applied in other different specific embodiments, and the details in this specification may be modified or modified based on different viewpoints and applications without deviating from the spirit of the present invention.

It should be noted that the illustrations provided in the embodiments only illustrate the basic concept of the present invention in a schematic manner. The illustrations only show the components related to the present invention and are not drawn based on the actual number, shape, and size of the components during implementation. The shape, quantity, and proportion of each component during actual implementation can be arbitrarily changed, and the layout of its components may also be more complex.

Figure 1:
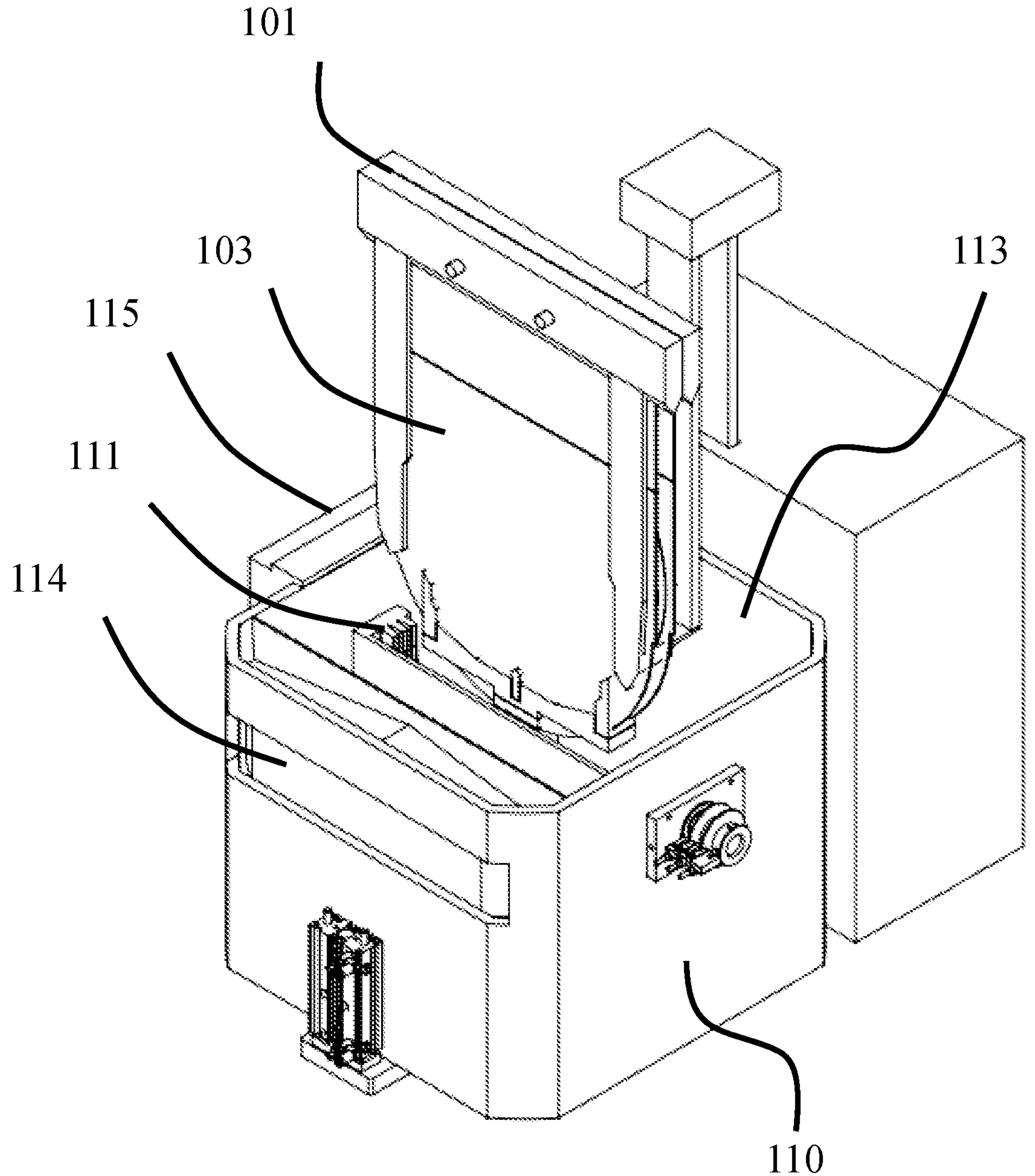
FIG. 1 and FIG. 2 show a wafer flipping and transfer process in a flipping mechanism in the background art.
Figure 2:
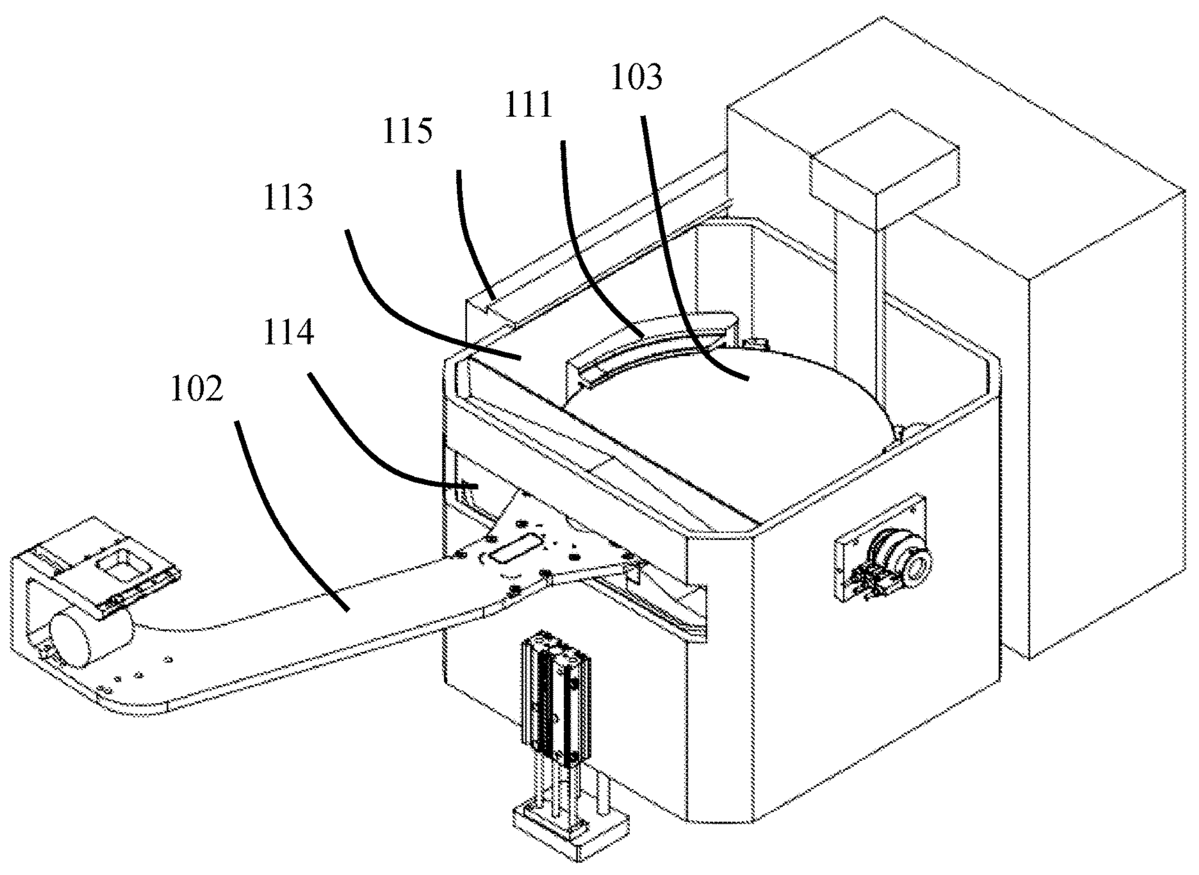
Figure 3:
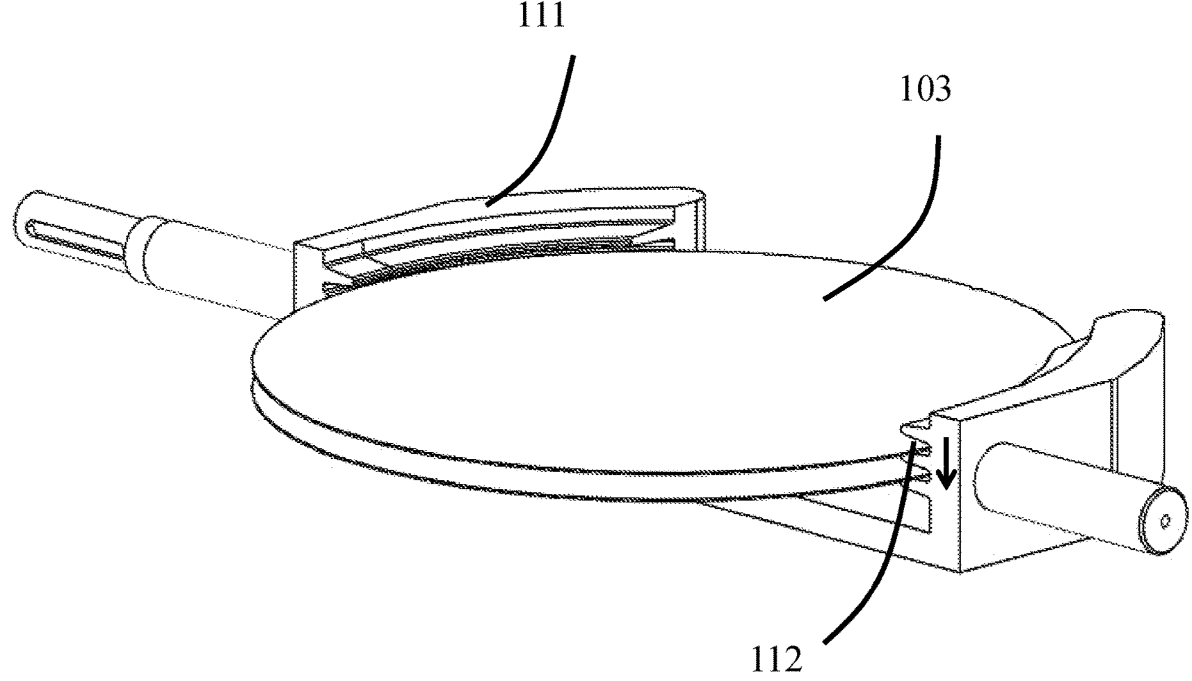
FIG. 3 is a schematic view of a wafer holder in the background art.
Figure 4:
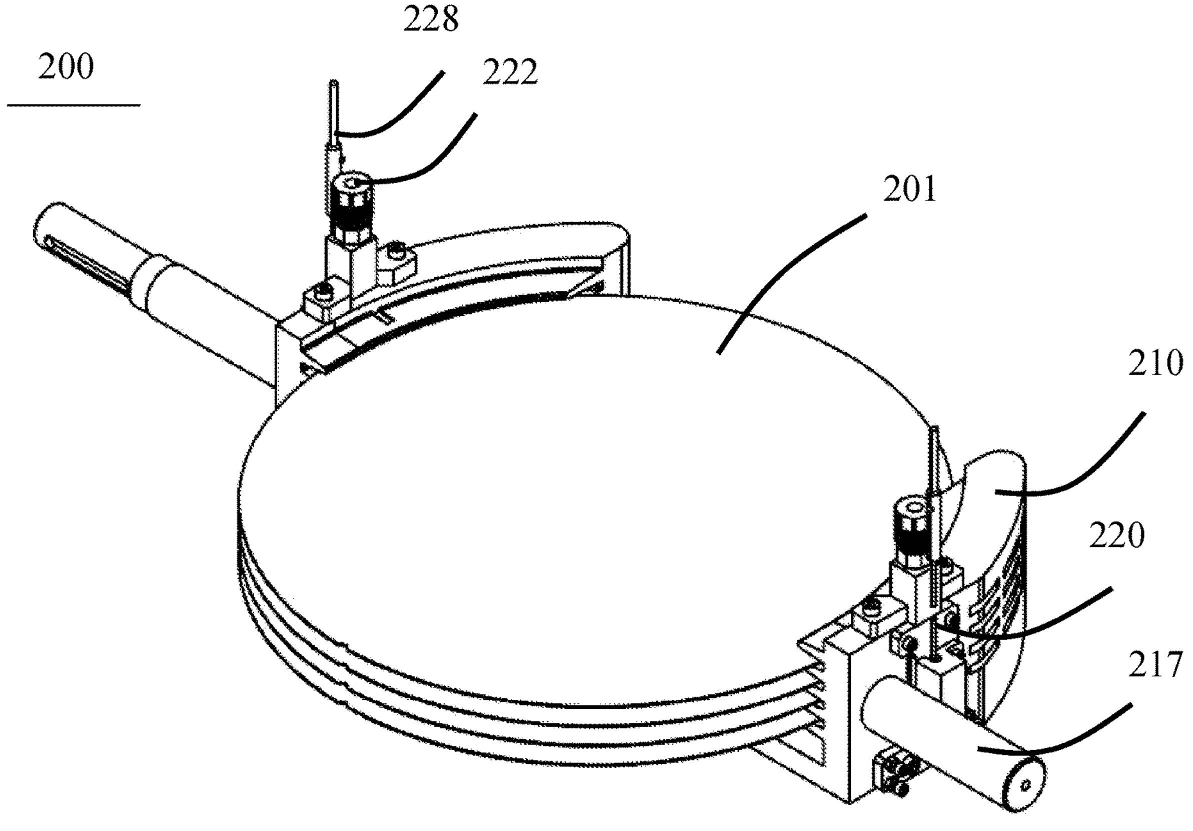
FIG. 4 is a schematic view of a flipping bracket according to the present invention.

Referring to FIG. 4, the overall structure of a flipping bracket 200 of the present invention is shown. The flipping bracket 200 mainly includes a bracket body 210 and a clamping apparatus 220. The clamping apparatus 220 is fixed to the bracket body 210 by fasteners for clamping or releasing wafers 201 held in the bracket body 210.

Figure 5:
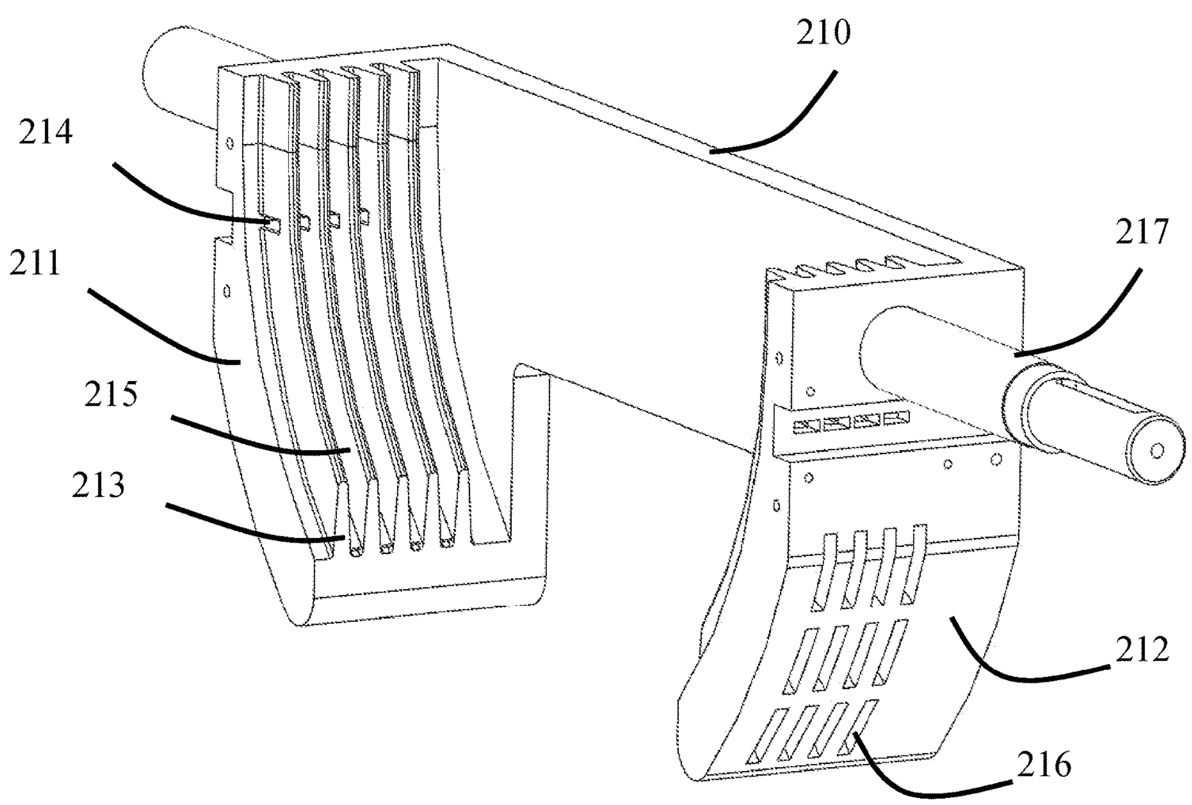
FIG. 5 is a schematic view of a bracket body according to the present invention.

Referring to FIG. 5, the bracket body 210 has a first side wall 211 and a second side wall 212. A plurality of partition plates 213 are formed on inner side surfaces of the first side wall 211 and the second side wall 212, and a carrier slot 215 is formed between every two adjacent partition plates 213, and a width of the carrier slot 215 is greater than a thickness of the wafer 201, which facilitates taking out and placing the wafer 201. Rotating shafts 217 are formed on outer side surfaces of the first side wall 211 and the second side wall 212, and at least one rotating shaft 217 is connected to a rotary driver (not shown in the figure), and the rotary driver drives the flipping bracket 200 to rotate which brings the wafer 201 held in the bracket body 210 to change a placement posture.

The bottom of each carrier slot 215 is hollowed out, and specifically, a plurality of liquid drain holes 216 are disposed at the bottom of the carrier slot 215, and for a process in which a chemical reagent needs to be sprayed to the wafer 201 during the flipping process of the wafers 201, the liquid drain holes 216 are conducive to quickly discharging the residual liquid in the carrier slot 215, and avoiding the accumulation of liquid in the carrier slot 215 and pollution of the surface of the wafers 201 caused by adsorbed particles and the like.

Figure 6:
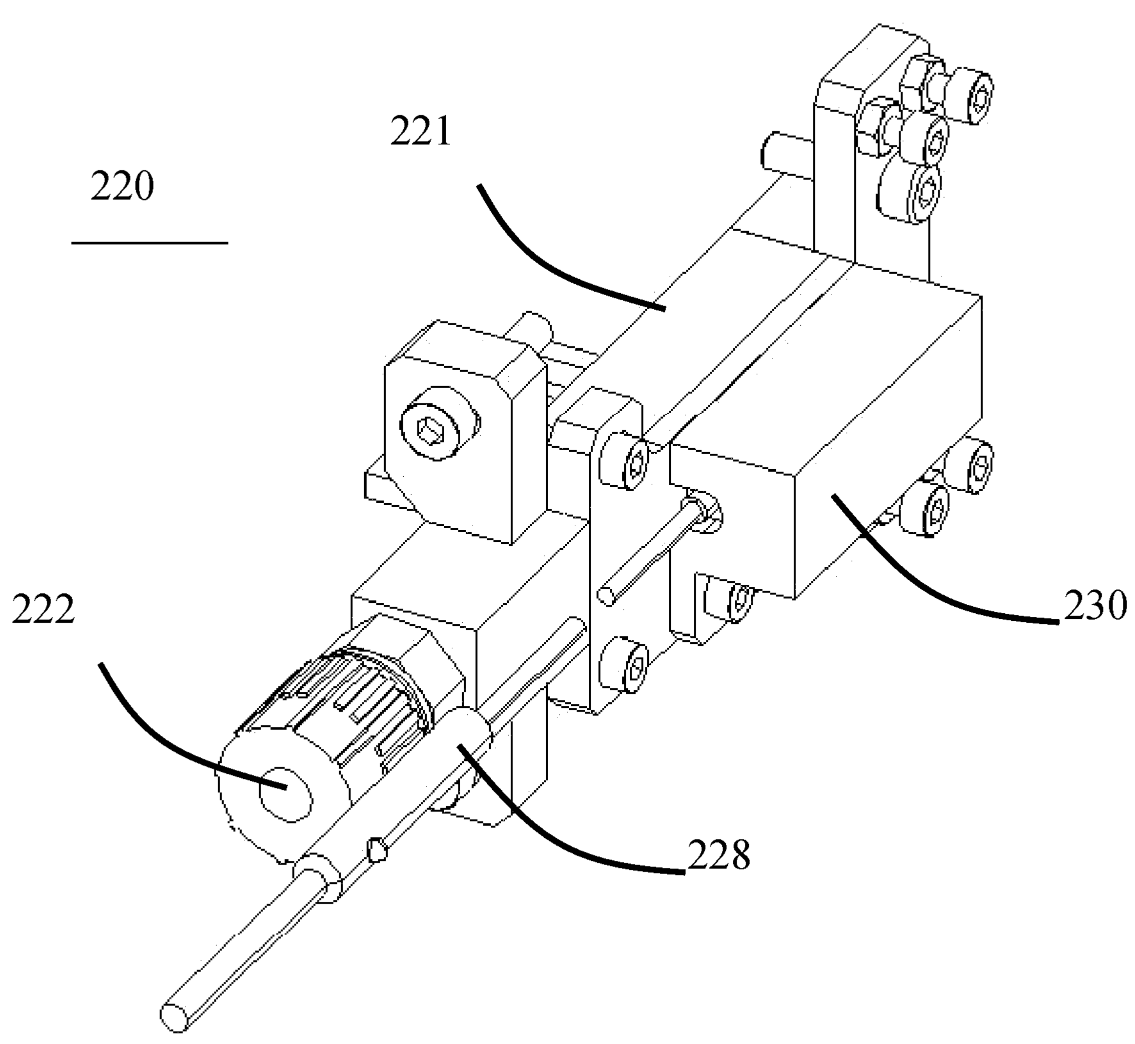
FIG. 6 is a schematic view of a clamping apparatus according to the present invention.
Figure 7:
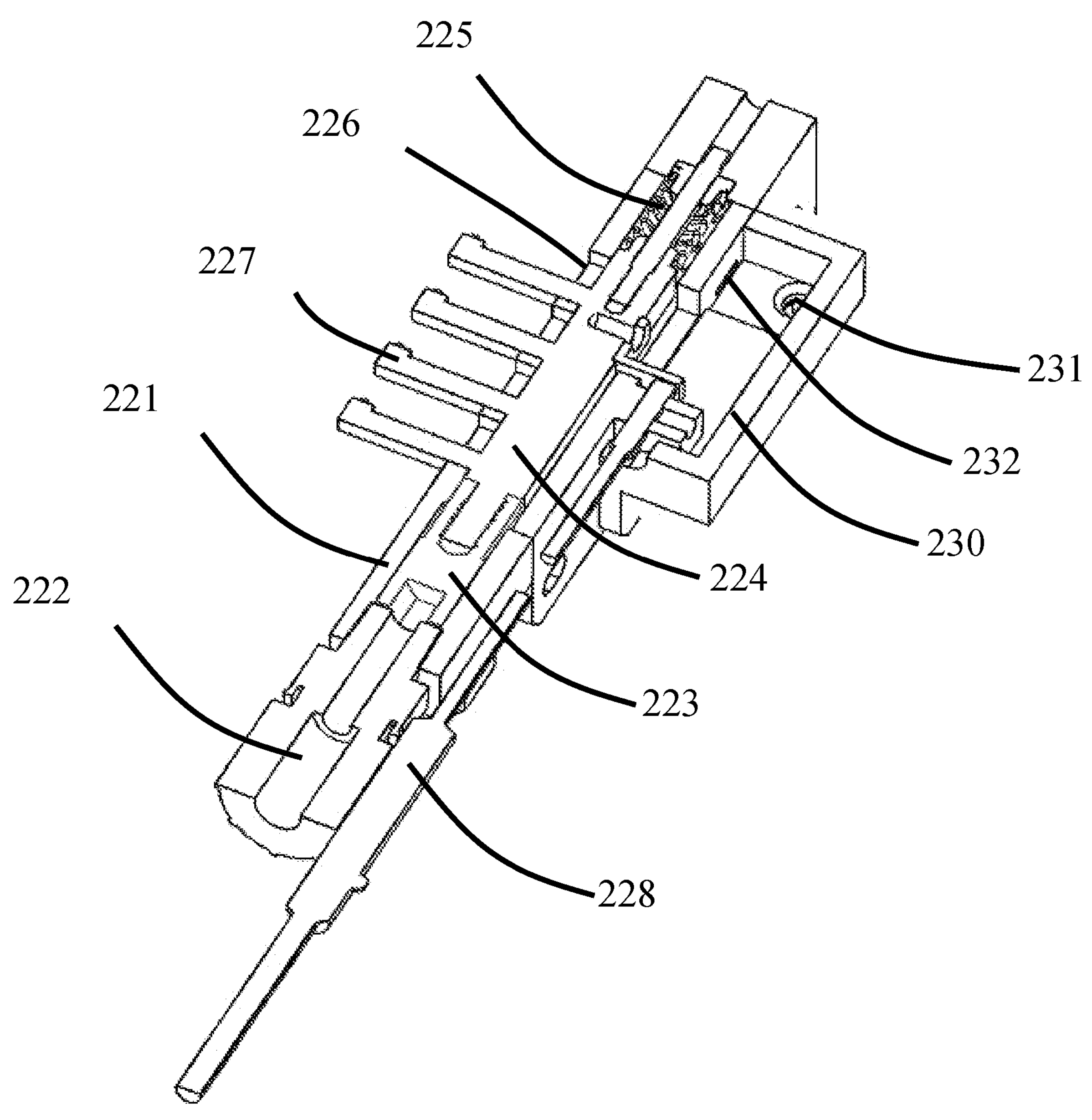
FIG. 7 is a cross-sectional view of the clamping apparatus of the present invention.

FIG. 6 and FIG. 7 show the structure of the clamping apparatus 220 of the present invention. One end of a housing 221 is provided with a gas port 222, and an inlet end of the gas port 222 is connected to a gas source. A piston 223 is disposed at an outlet end of the gas port 222. The piston 223 may slide in the housing 221 under the action of a gas driving force provided by the gas source. One end of a telescopic rod 224 is fixedly connected to the piston 223, and may be driven by the piston 223 to slide in the housing 221. A reset spring 225 is disposed between the other end of the telescopic rod 224 and the housing 221, and when the gas source is cut off, the telescopic rod 224 and the piston 223 are reset under the action of the reset spring 225. A plurality of limiting slots 226 are provided on one side of the housing 221, and the plurality of limiting slots 226 are arranged at equal intervals along the length direction of the telescopic rod 224. Corresponding to the plurality of limiting slots 226, a plurality of limiting rods 227 are disposed on one side of the telescopic rod 224, and a free end of each limiting rod 227 passes through the respectively corresponding limiting slot 226 and extends into the bracket body 210. Accommodating grooves 214 for accommodating the limiting rods 227 are disposed on the partition plates 213 of the bracket body 210. Movement of the telescopic rod 224 drives the plurality of limiting rods 227 to move in the limiting slots 226 to make the limiting rods 227 press or release the wafer 201.

Figure 8:
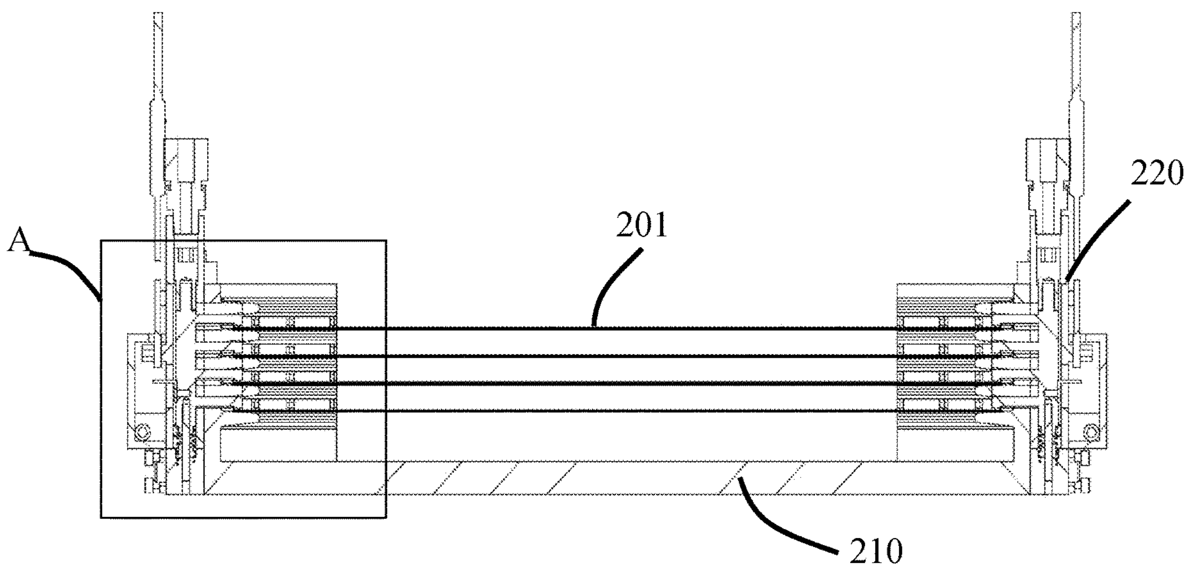
FIG. 8 is a cross-sectional view of the flipping bracket of the present invention.
Figure 9:
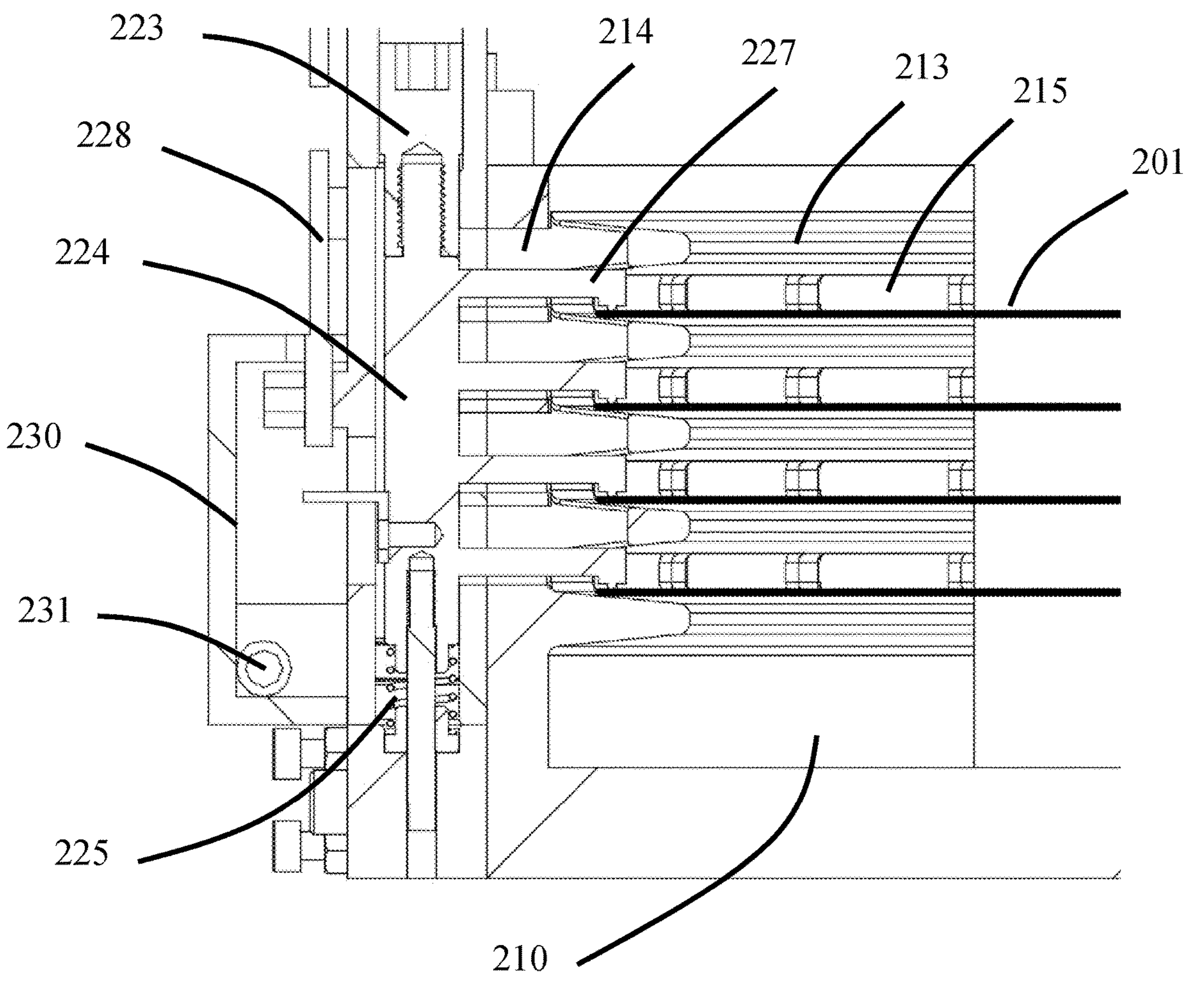
FIG. 9 is a partially enlarged view at point A in FIG. 8.
Figure 10:
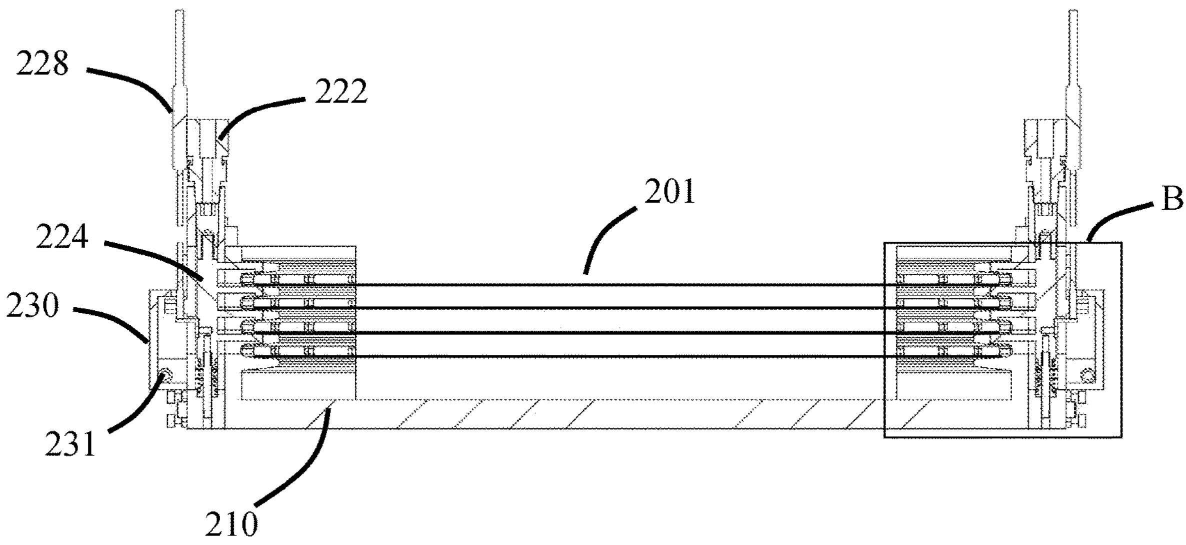
FIG. 10 is another cross-sectional view of the flipping bracket of the present invention.
Figure 11:
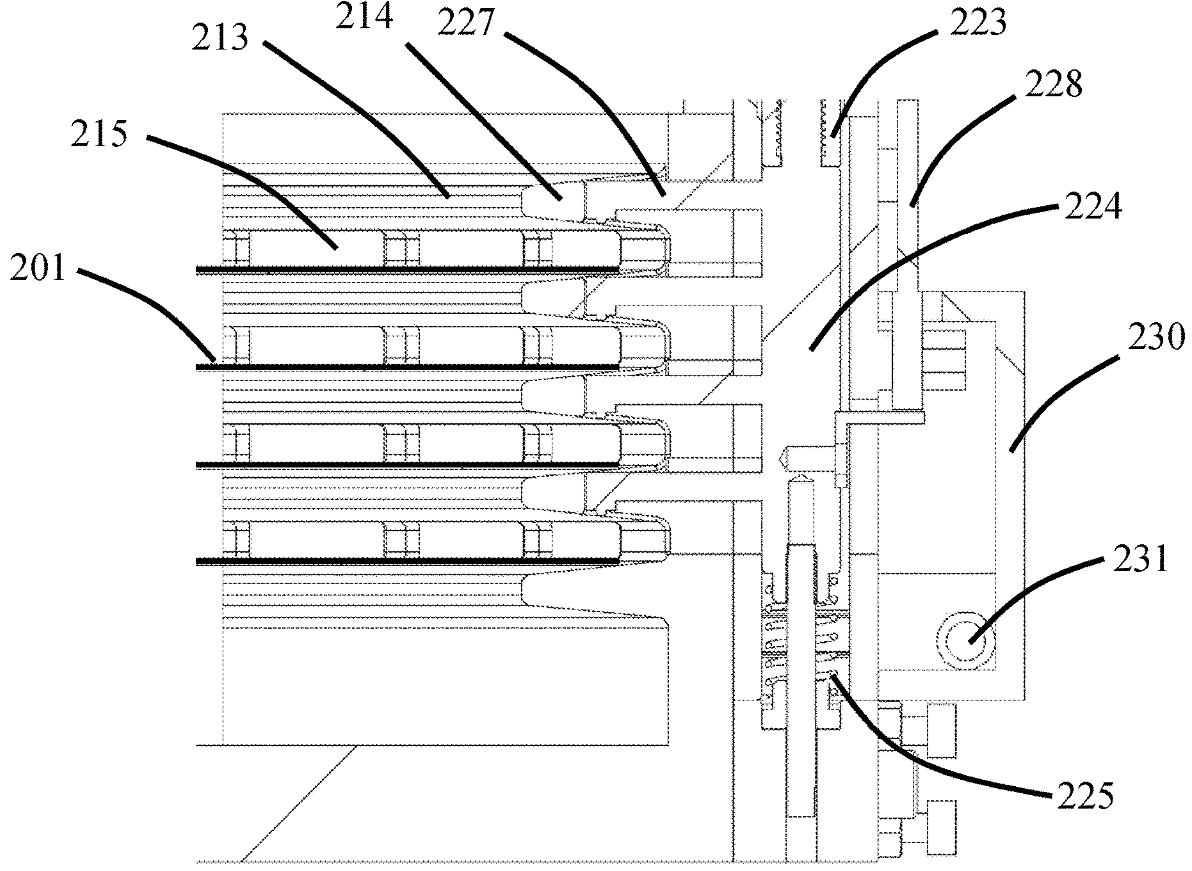
FIG. 11 is a partially enlarged view at point B in FIG. 10.

FIG. 8 and FIG. 9 show schematic views of the clamping apparatus 220 of the present invention pressing the wafer 201. When the gas source is turned on, the piston 223 pushes the telescopic rod 224 to slide towards the wafer 201, and the limiting rod 227 disposed on the telescopic rod 224 moves out of the accommodating groove 214 and gradually approaches the surface of the wafer 201, so that the plurality of wafers 201 are synchronously pressed against the same side of the partition plates 213, and the wafers 201 are fixed in the carrier slots 215, and the plurality of wafers 201 are kept at the same spacing, so as to facilitate a subsequent operation of taking out the wafers 201 by the robot. FIG. 10 and FIG. 11 show schematic views of the clamping apparatus 220 according to the present invention releasing the wafer 201. When the gas source is cut off, the piston 223 and the telescopic rod 224 slide in the direction away from the wafer 201 by action of the reset spring 225, and the limiting rods 227 disposed on the telescopic rod 224 gradually separates from the surface of the wafers 201 and returns to the initial position. When the limiting rods 227 return to the initial position, the limiting rods 227 are completely accommodated in the accommodating grooves 214 provided on the partition plates 213, which can prevent the limiting rods 227 from protruding into the carrier slots 215 and fragments or scratches caused by interfering with the limiting rods 227 when the wafers 201 are placed or taken out.

To detect accuracy of the moving position of the telescopic rod 224, the clamping apparatus 220 is further provided with a displacement sensor 228 for measuring the displacement of the telescopic rod 224, so as to further ensure normal operation of the clamping apparatus 220.

Figure 12:
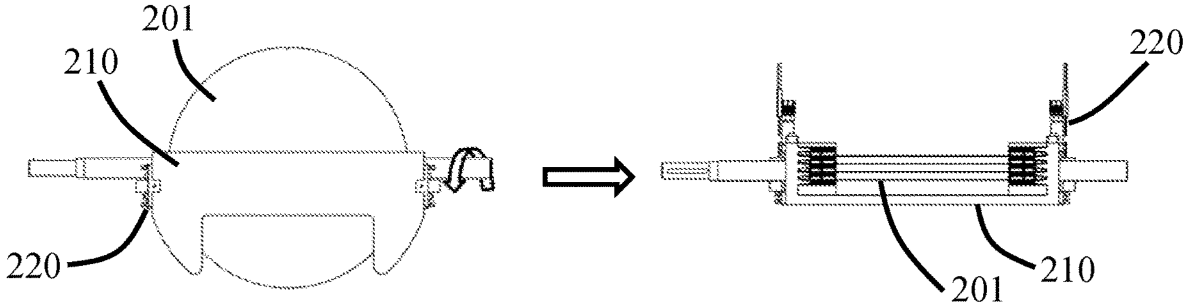
FIG. 12 is a schematic view showing the variation of the flipping bracket while the flipping bracket rotates from a vertical posture to a horizontal posture according to the present invention.

FIG. 12 shows a schematic view of rotating the wafers 201 from a vertical posture to a horizontal posture in the embodiment. After the flipping bracket 200 receives the wafers 201 in the vertical posture, before the rotation, the gas source is turned on, and as shown in FIG. 9, the limiting rods 227 synchronously presses the plurality of wafers 201 against the same side of the partition plates 213, and then the rotary driver drives the flipping bracket 200 to rotate to the horizontal posture, and therefore, shaking and collision of the wafers 201 in the carrier slots 215 in the rotation process are avoided. After the wafers 201 are flipped to a horizontal posture, the gas source is cut off, and as shown in FIG. 11, after the limiting rods 227 reset and release the wafers 201, then the wafers 201 are taken out from the flipping bracket 200 by the robot.

As an example, the clamping apparatus 220 is further provided with a liquid discharge chamber 230. The liquid discharge chamber 230 is provided with a discharge port 231. The liquid discharge chamber 230 is mainly used to collect and discharge liquid accumulated inside the housing 221, especially discharge the liquid remaining at the installation position of the reset spring 225. Referring to FIG. 6 and FIG. 7 again, the liquid discharge chamber 230 is disposed on the housing 221, and a through hole 232 communicating with the installation position of the reset spring 225 and the liquid discharge chamber 230 is provided inside the liquid discharge chamber 230, so that the liquid that penetrates into the clamping apparatus 220 can be discharged in time through the liquid discharge chamber 230. In some processes, while the wafers 201 are flipping, a chemical liquid needs to be sprayed on the surface of the wafers 201 to process the surface of the wafers 201. For example, in a cleaning process, when the wafers 201 are flipping, deionized water needs to be sprayed to ensure that a predetermined thickness water film is formed on the surface of the wafers 201, so as to reduce particle pollution. In the embodiment, the limiting slots 226 provided by the housing 221 of the clamping apparatus 220 and the accommodating grooves 214 provided by the bracket body 210 form interchange channels inside the bracket body 210 and the clamping apparatus 220, and although the chemical liquid is sprayed toward the wafers 201 held on the bracket body 210, it is impossible to avoid that part of the chemical liquid enters the clamping apparatus 220 through the interchange channels. If the liquid at the installation position of the reset spring 225 cannot be discharged, a large water pressure will be generated when the liquid accumulates to a certain extent, and this will cause the clamping apparatus 220 to fail, and the limiting rods 227 cannot press the wafers 201 after the gas source is turned on.

Figure 13:
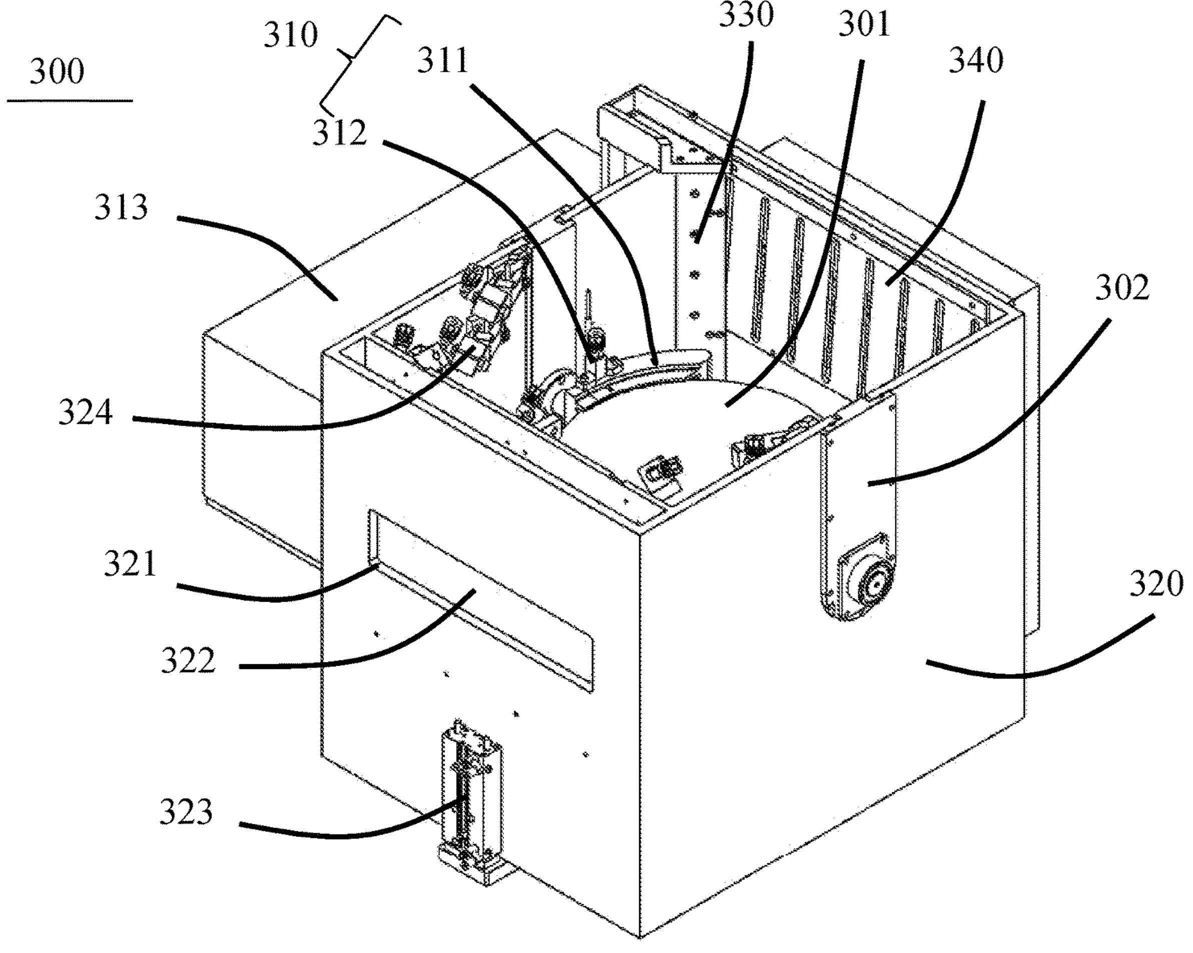
FIG. 13 is a schematic view of a flipping apparatus according to the present invention.

FIG. 13 shows an overall view of a flipping apparatus 300 according to the present invention. The flipping apparatus 300 includes a flipping bracket 310. The structure of the flipping bracket 310 is the same as that of the flipping bracket 200, and both include a bracket body 311 and a clamping apparatus 312, and details are not described herein again. In this embodiment, the flipping apparatus 300 further includes a box body 320. A top opening of the box body 320 is configured to receive the wafers 301. A loading port 321 is disposed on a front wall of the box body 320 for taking out the wafers 301. A door plate 322 may be disposed at the loading port 321, and the door plate 322 is driven by a cylinder 323 to open or close the loading port 321. The flipping bracket 310 is installed in the box body 320 through a support arm 302, and a rotary driver 313 that drives the flipping bracket 310 to rotate is integrated on a side wall of the box body 320. The top portion of the box body 320 is provided with a plurality of nozzles 324 around the flipping bracket 310 for spraying a misty liquid onto the wafers 301 held within the flipping bracket 310.

Figure 14:
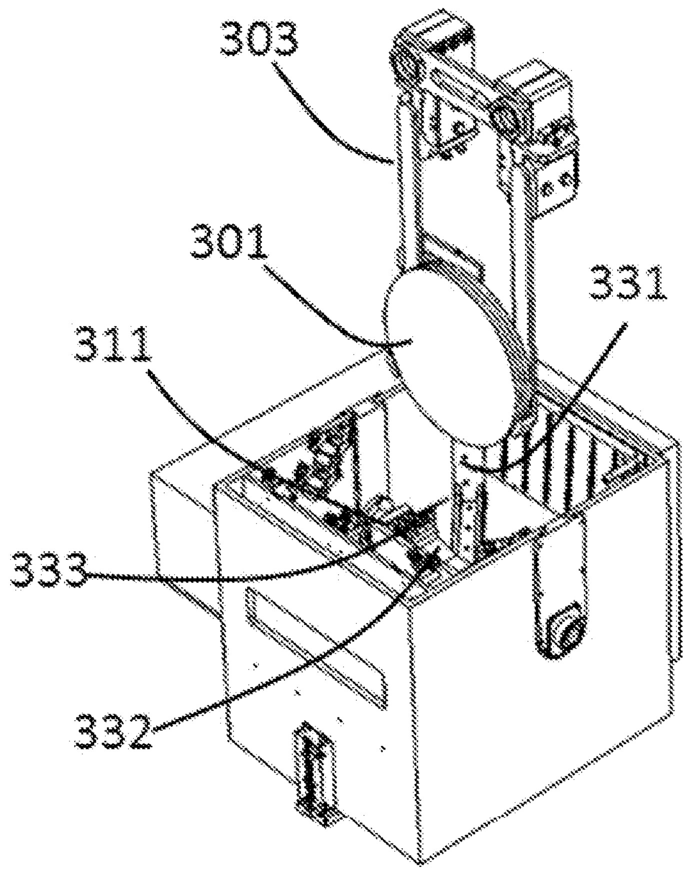
FIG. 14 is a schematic view showing the wafers are transferred to the top of the flipping apparatus according to the present invention.
Figure 15:
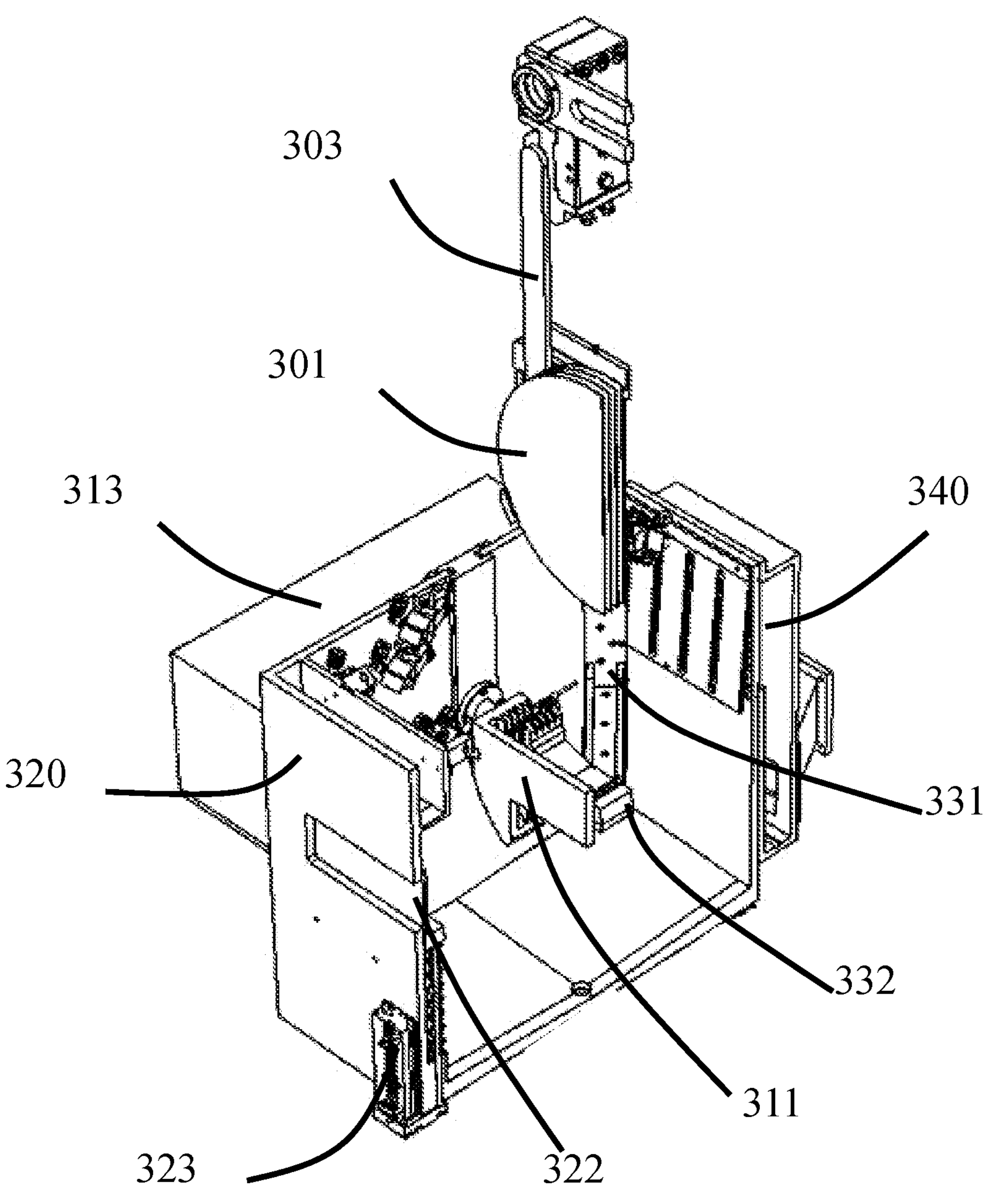
FIG. 15 is a cross-sectional view of the flipping apparatus shown in FIG. 14.
Figure 16:
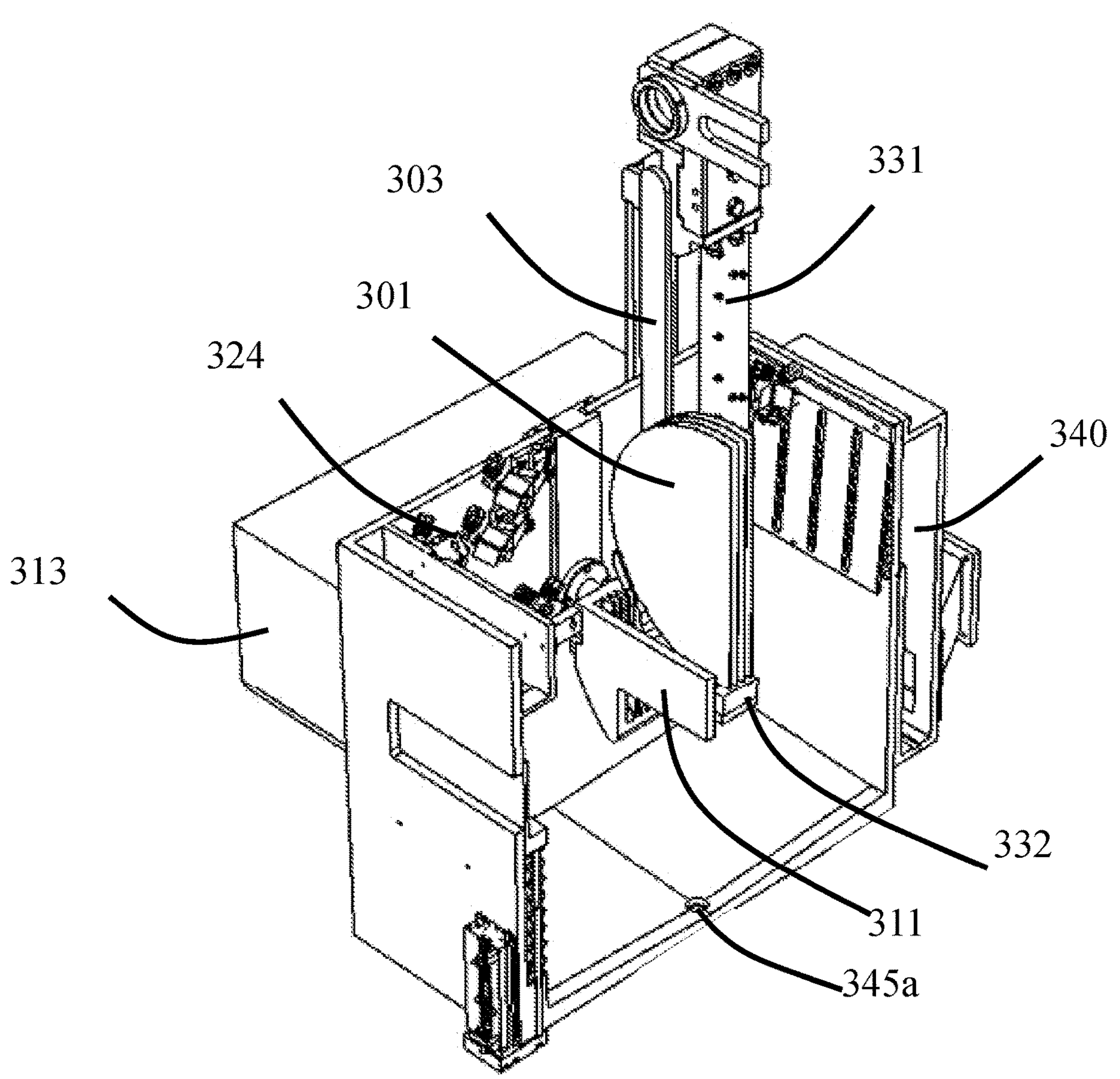
FIGS. 16 to 18 show the process of transferring the wafers to the flipping bracket according to the present invention.
Figure 17:
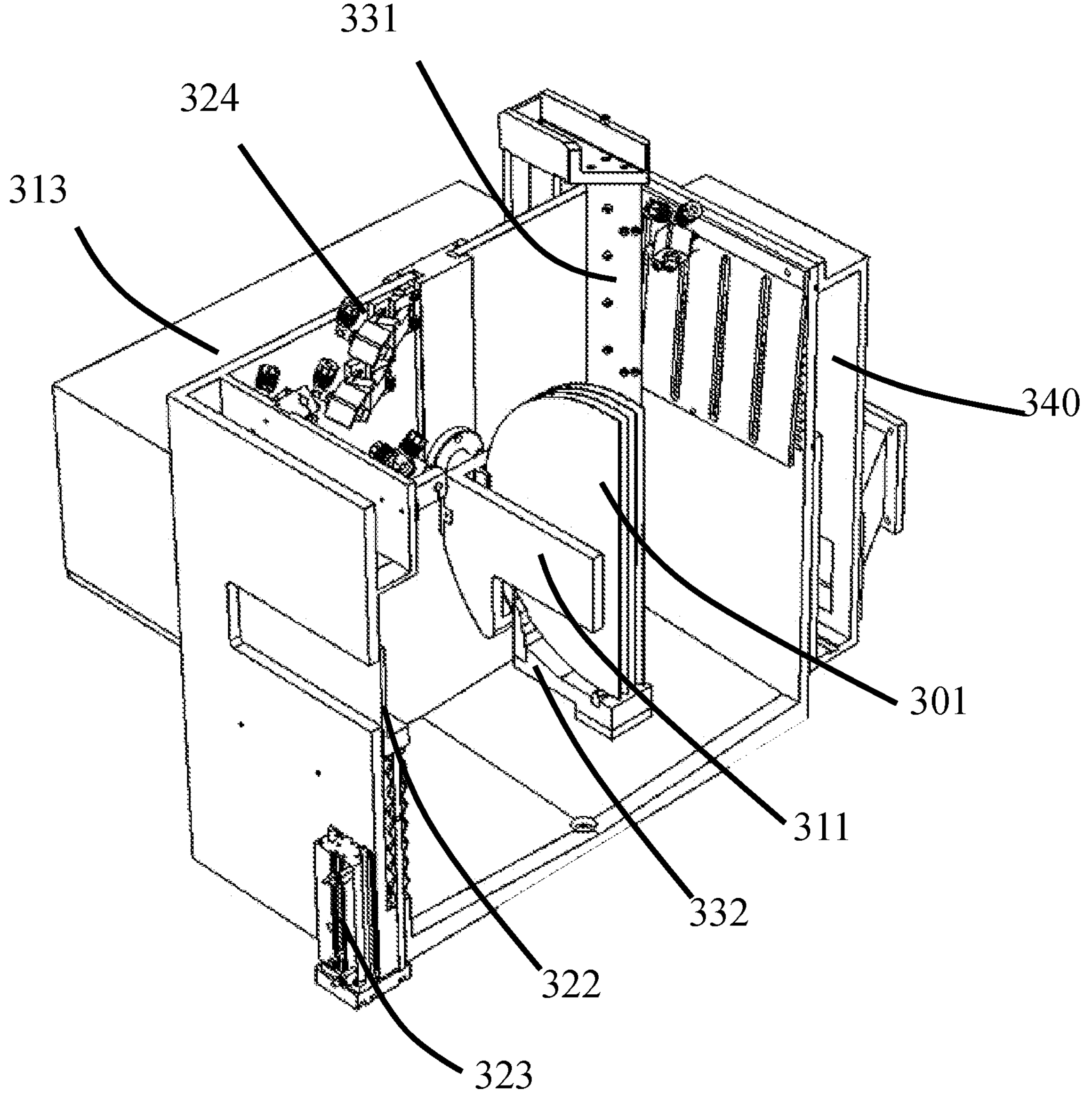
Figure 18:
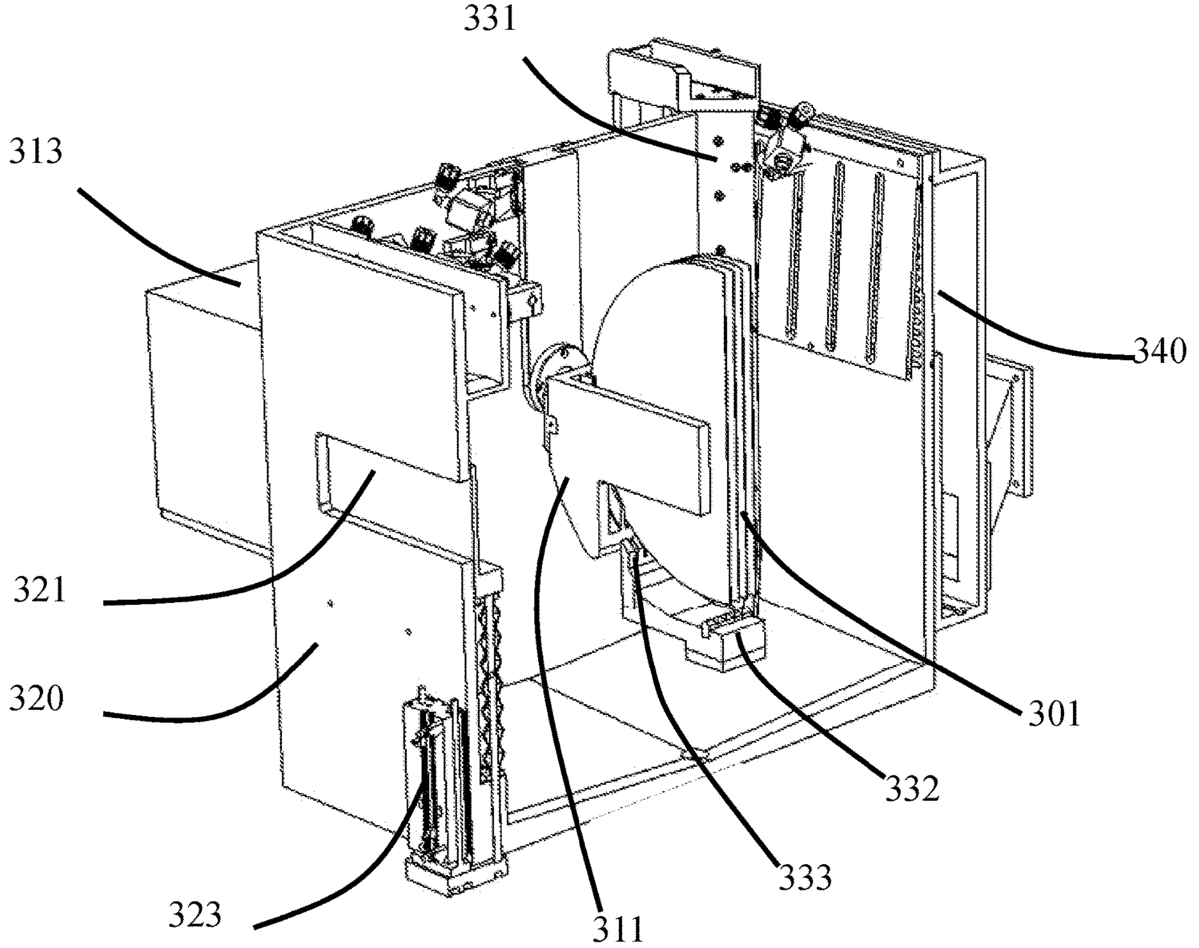

As an example, a lifting mechanism 330 for transferring the wafers 301 is also provided in the flipping apparatus 300. Referring to FIG. 14 and FIG. 15, the lifting mechanism 330 includes a lifting rod 331 and a support base 332 fixed to a lower end of the lifting rod 331. Locating slots 333 for holding the wafers 301 is disposed on a bottom surface of the support base 332. Referring to FIG. 14 again, the first robot 303 grasps several wafers 301 from a cleaning tank, and transfers the wafers 301 to the top of the flipping apparatus 300, and in this case, the bracket body 311 is in a vertical posture, and the lifting rod 331 drives the support base 332 to rise. The locating slots 333 on the support base 332 are in one-to-one correspondence with the carrier slots of the bracket body 311. FIGS. 16 to 18 illustrate the process of the wafers 301 transferring from the support base 332 to the flipping bracket 310. The first robot 303 firstly places the wafers 301 on the support base 332, and then the first robot 303 is removed. The wafers 301 are gradually placed in the carrier slots of the bracket body 311 in the process of the wafers 301 descending along with the support base 332. After the wafers 301 are located in the flipping bracket 310, the support base 332 continues to move downward and is separated from the wafers 301, and the transfer of the wafers 301 from the support base 332 to the flipping bracket 310 is completed.

Figure 19:
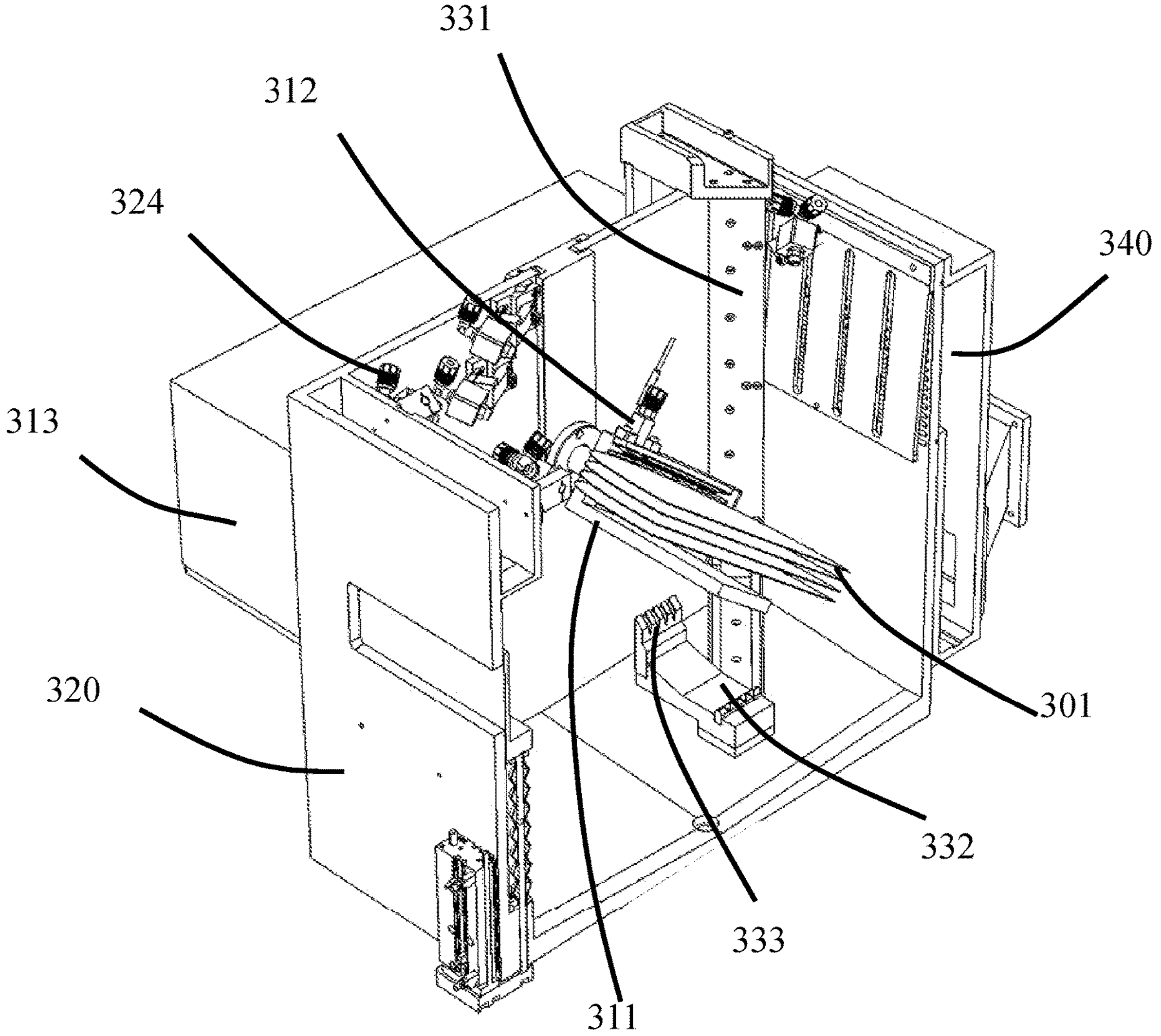
FIG. 19 is a cross-sectional view of the flipping apparatus when the wafers are in an inclined posture according to the present invention.
Figure 20:
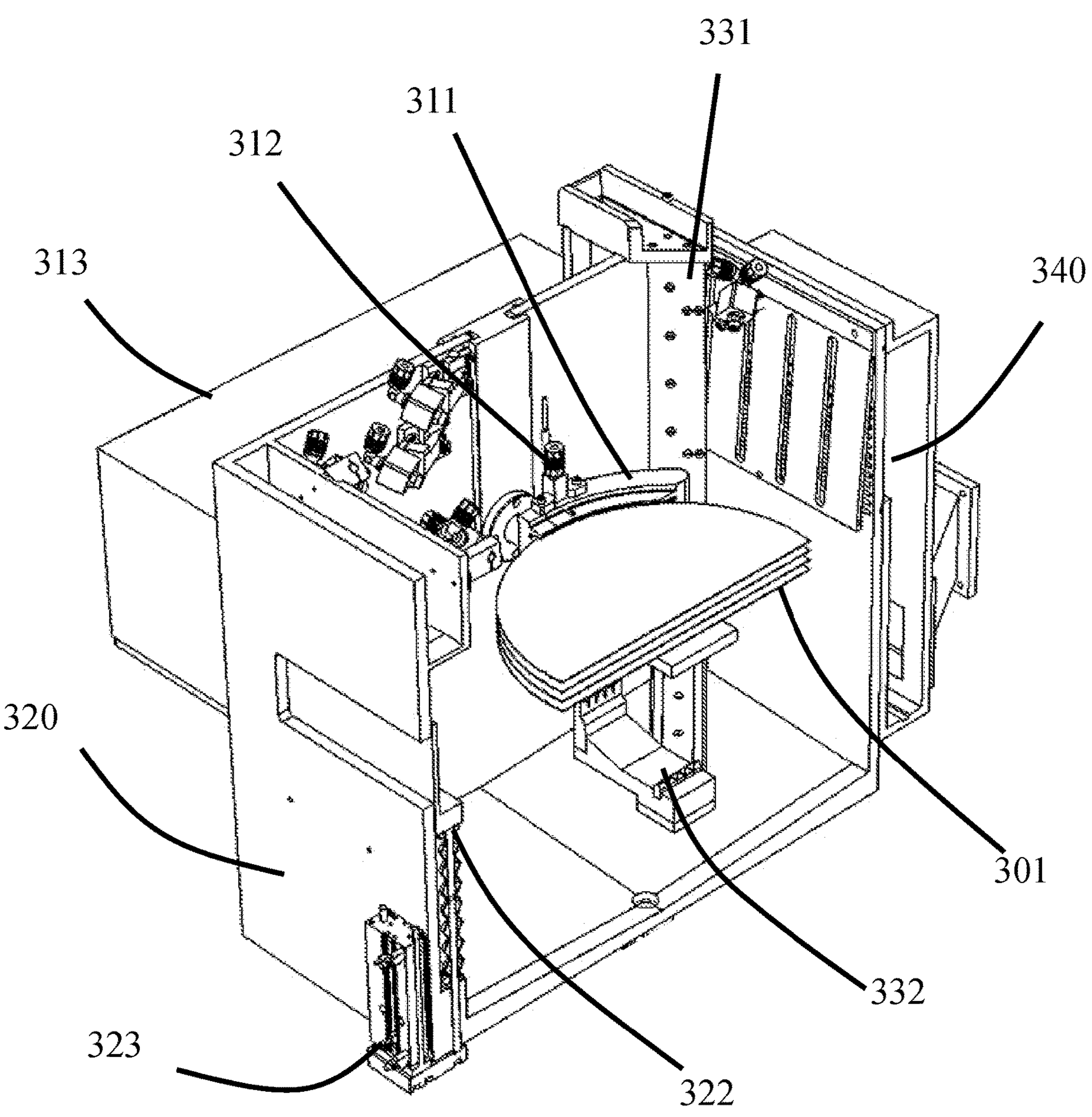
FIG. 20 is a cross-sectional view of the flipping apparatus when the wafers are in a horizontal posture according to the present invention.
Figure 21:
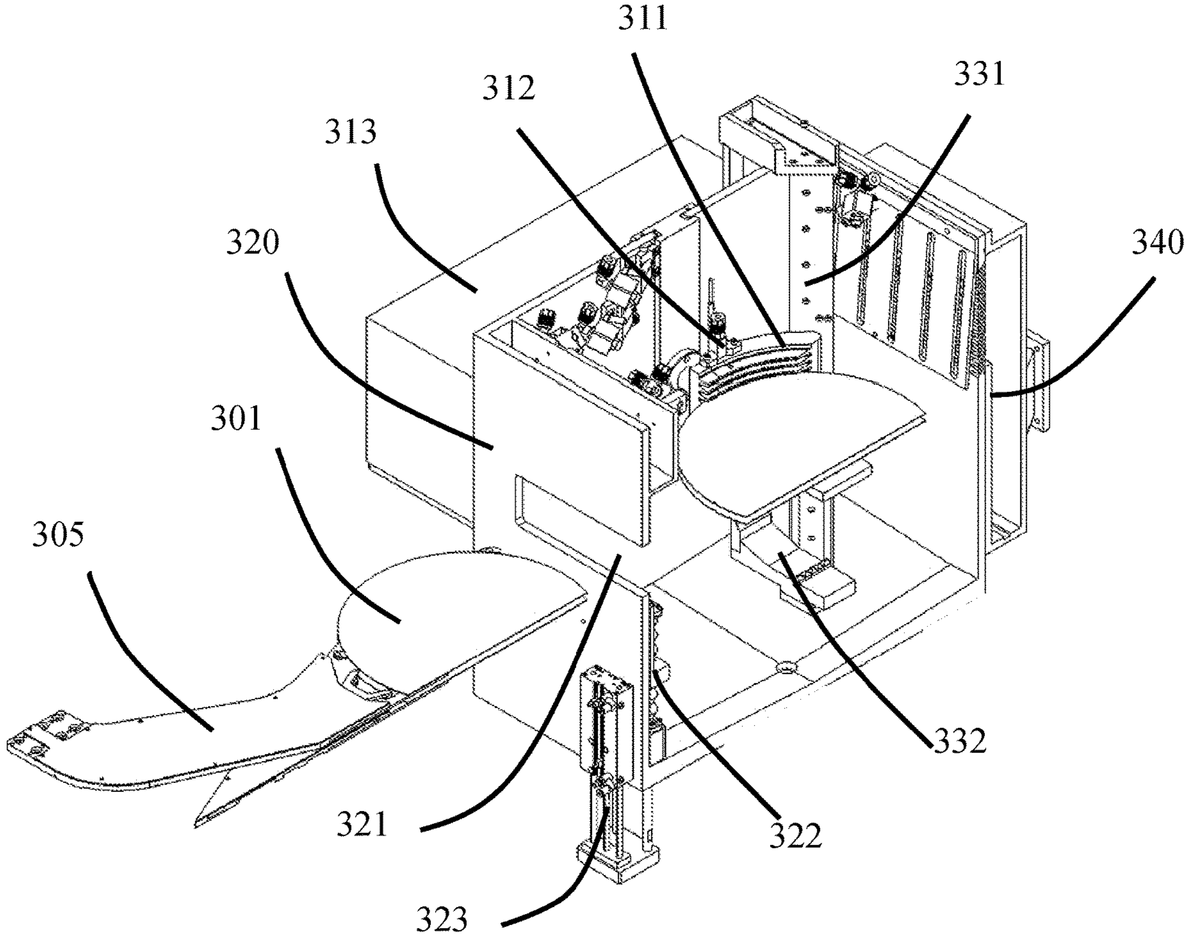
FIG. 21 is a cross-sectional view of the flipping apparatus when a robot takes out a wafer horizontally according to the present invention.

After the wafers 301 are transferred to the flipping bracket 310, the clamping apparatus 312 presses the wafers 301 against the same side of the partition plates, so that the wafers 301 are arranged neatly and equidistantly on the flipping bracket 310, and on the other hand, the wafers 301 are fixed in the carrier slots, so that the wafers 301 do not wobble in the carrier slots when the flipping bracket 310 rotates. Subsequently, the rotary driver 313 drives the flipping bracket 310 to rotate to change the wafers 301 from a vertical posture to a horizontal posture. As shown in FIG. 20, the nozzles 324 continuously spray misty liquid during the rotation of the flipping bracket 310 to form a liquid film with predetermined thickness on the surface of the wafers 301 so as to protect the surface of the wafers 301 without being tarnished. After the wafers 301 are rotated to the horizontal posture, the clamping apparatus 312 releases the wafers 301. The loading port 321 is opened, and a second robot 305 horizontally extends into the box body 320 to take out the wafer 301 in the horizontal posture, as shown in FIG. 21. Before the wafers 301 are rotated horizontally, the wafers 301 are slightly paused in an inclined posture, and as shown in FIG. 19, the thickness of the liquid film formed on the surface of the wafers 301 is adjusted by adjusting the inclined angle, and the front surface of the wafers 301 is sufficiently wetted.

Referring to FIG. 13 again, the box body 320 is further disposed an exhaust device 340 for maintaining cleanliness and humidity of the process atmosphere. The exhaust device 340 needs to be connected to the factory's exhaust system, and it needs to avoid liquid being sucked into the exhaust system, otherwise it may cause corrosion and damage to exhaust ducts or fan. Because the nozzles 324 continuously spray the misty liquid, process gas in and around the box body 320 has high humidity, and based on this, the exhaust device 340 disposed on the box body 320 in this embodiment has a gas-liquid separation function, so as to prevent liquid from being sucked into the exhaust system.

Figure 22:
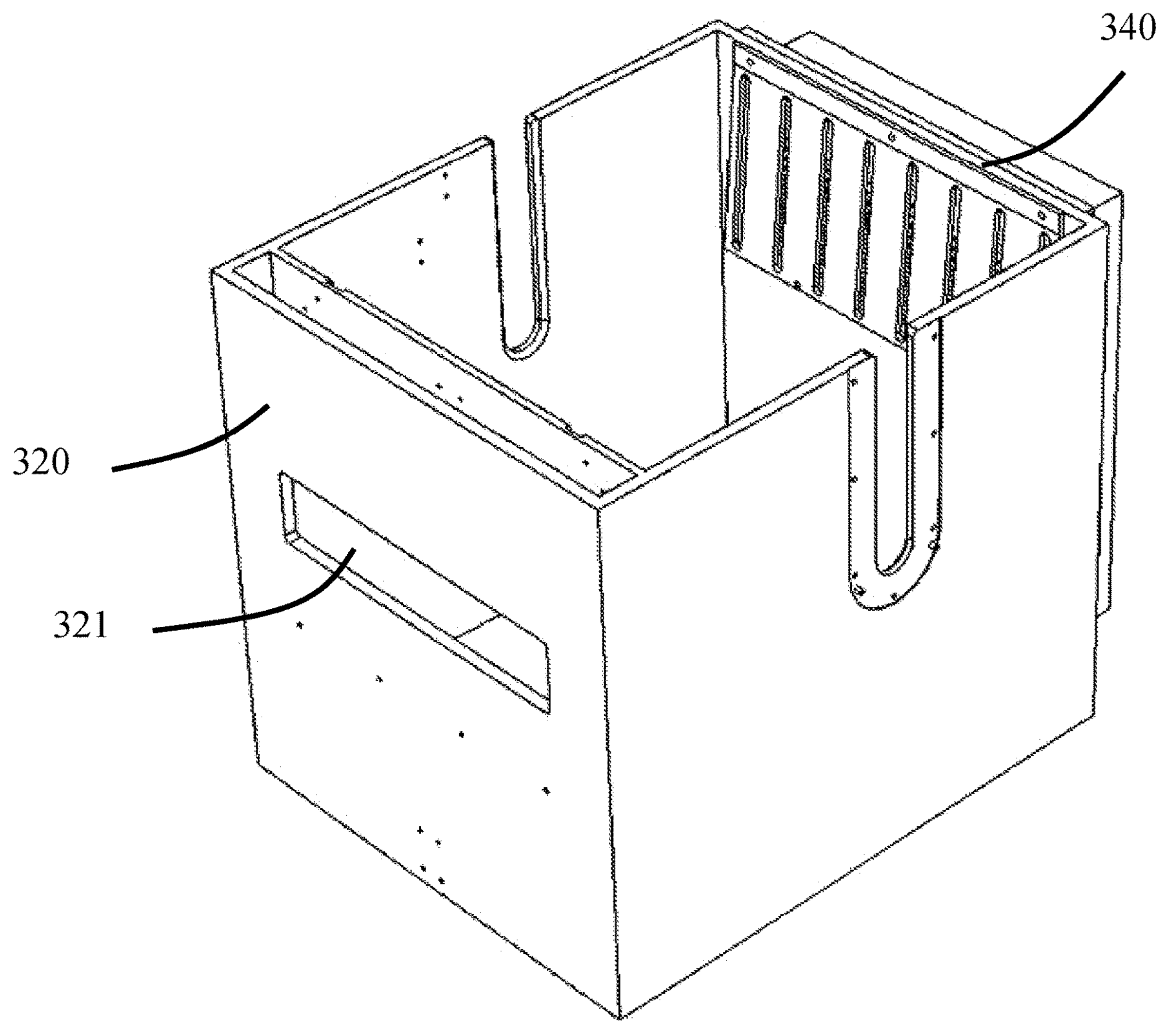
FIG. 22 is a schematic view of a box body of the flipping apparatus according to the present invention.
Figure 23:
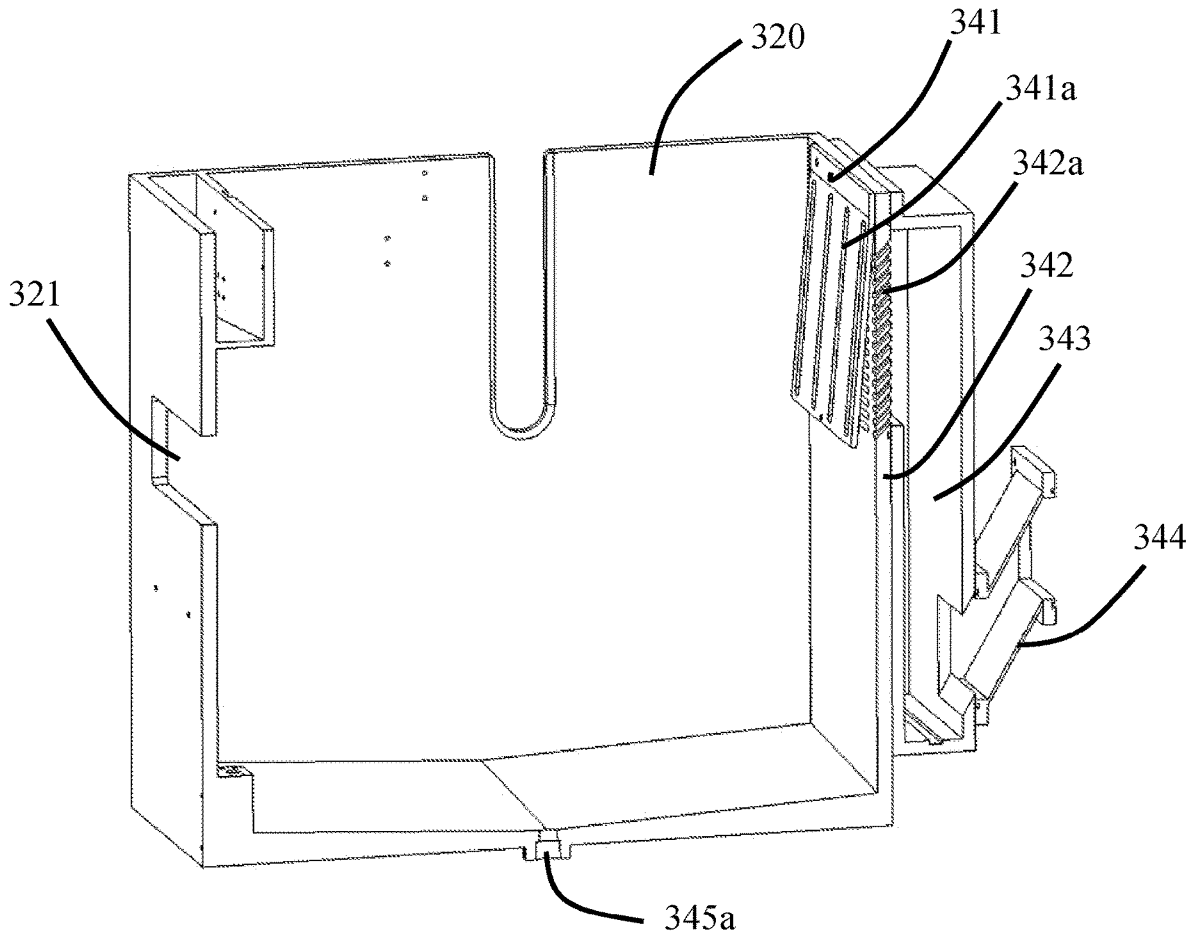
FIG. 23 is a cross-sectional view of the box body of the flipping apparatus according to the present invention.
Figure 24:
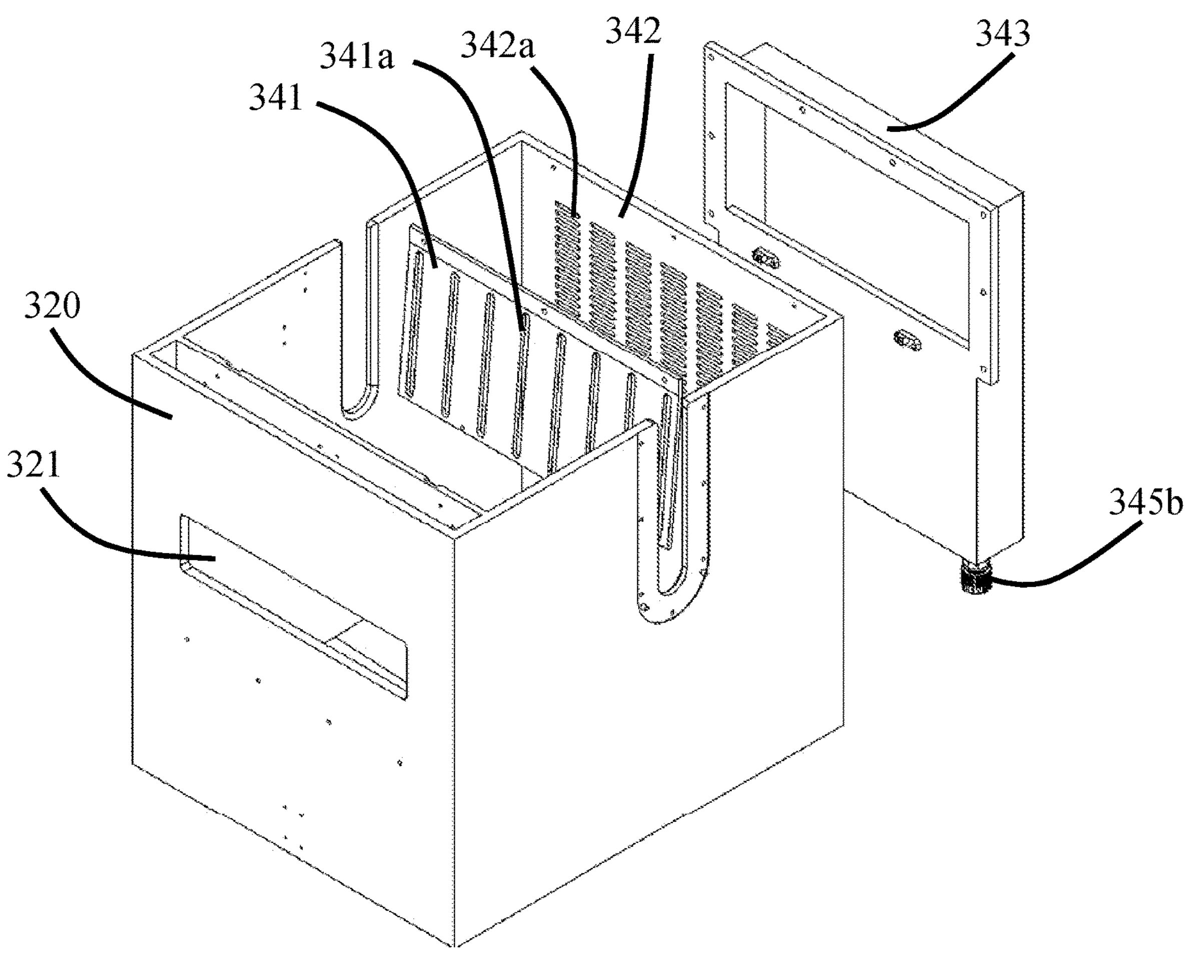
FIG. 24 is an exploded view of the box body of the flipping apparatus according to the present invention.

FIG. 22 shows a schematic view of the box body 320 according to the present invention. The exhaust device 340 is mounted on the rear wall of the box body 320. Referring to FIG. 23 and FIG. 24, the exhaust device 340 is provided with a first exhaust plate 341, a second exhaust plate 342, a liquid collecting cavity 343, and an exhaust port 344 which are sequentially arranged along the air flow direction. The exhaust port 344 is configured to connect to a fan of the factory's exhaust system. In this embodiment, the second exhaust plate 342 and the rear wall of the box body 320 are integrally formed, and it may be understood that, in another embodiment, the second exhaust plate 342 may be an independent member. The first exhaust plate 341 is provided with multiple first air vents 341*a*. The second exhaust plate 342 is provided with multiple second air vents 342*a*. A space is reserved between the first exhaust plate 341 and the second exhaust plate 342, and specifically, the first exhaust plate 341 is arranged in an inclined manner relative to the second exhaust plate 342, and the first air vents 341*a* and the second air vents 342*a* are arranged in a staggered manner, that is, the first air vents 341*a* and the second air vents 342*a* do not overlap. The airflow flowing out through the first air vents 341*a* do not directly flow through the second air vents 342*a*, but first flows to the non-porous area of the second exhaust plate 342. The airflow hits against the non-porous area of the second exhaust plate 342, which can reduce the air velocity and cause a part of the liquid trapped in the airflow to flow along the second exhaust plate 342, and then the airflow flows to the second air vents 342*a*. Therefore, the staggered arrangement design of the first air vents 341*a* and the second air vents 342*a* can not only reduce the airflow speed, change the airflow path, avoid the airflow wrapped with a large amount of liquid to be directly sucked to the factory's exhaust system, corroding and damaging the fan or exhaust ducts, but also prolong the time for the airflow to flow through the exhaust device 340, thereby prolonging the time for gas-liquid separation and reducing the amount of liquid entering the exhaust system.

As an example, both the second air vents 342*a* and the exhaust port 344 are arranged obliquely upward, further promoting gas-liquid separation and reducing the amount of liquid entering the exhaust system. In addition, liquid discharge ports (345*a*, 345*b*) are respectively provided at the bottom of the box body 320 and the liquid collecting cavity 343 for discharging the collected liquid.

The flipping apparatus of the present invention is provided with a flipping bracket, and the flipping bracket comprises a bracket body and a clamping apparatus, and the clamping apparatus is disposed on the bracket body holding the wafers, and the wafers are fixed by the clamping apparatus when the flipping bracket rotates, so that the wafers can effectively avoid wobbling in the flipping bracket and there are no fragments or wafer surface scratches when the posture of the wafers is changed along with the flipping bracket.

The above embodiments are provided to those skilled in the art to realize or use the invention, under the condition that various modifications or changes being made by those skilled in the art without departing the spirit and principle of the invention, the above embodiments may be modified and changed variously, therefore the protection scope of the invention is not limited by the above embodiments, rather, it should conform to the maximum scope of the innovative features mentioned in the Claims.

What is claimed is:

1. A flipping apparatus, comprising:

a bracket body, wherein a plurality of partition plates are formed on inner side surfaces of two side walls of the bracket body, carrier slots for placing wafers are formed between adjacent partition plates, and rotating shafts are formed on outer side surfaces of the two side walls of the bracket body;

a rotary driver, connected to at least one rotating shaft to drive the bracket body to rotate; and a clamping apparatus, disposed on the side wall of the bracket body and being used to press or release the wafers placed in the carrier slots;

wherein the clamping apparatus comprises:

a plurality of limiting rods, wherein the plurality of limiting rods are configured to approach the surfaces of the wafers placed in the carrier slots to press a plurality of wafers against the same side of the partition plates before the rotary driver drives the bracket body to rotate, and to separate from the surfaces of the wafers placed in the carrier slots to release the wafers after the wafers are flipped to a horizontal posture.

2. The flipping apparatus according to claim 1, wherein the clamping apparatus comprises:

a housing, fixed on the side wall of the bracket body;

a gas port, located at one end of the housing, and used to connect to a gas source;

a piston, being slidably arranged in the housing and provided with driving force by the gas source;

a telescopic rod, being slidably arranged in the housing, and one end of the telescopic rod being fixedly connected with the piston;

a reset spring, being arranged at the other end of the housing and connected with the other end of the telescopic rod for resetting the piston and the telescopic rod;

a plurality of limiting slots, being arranged on one side of the housing and arranged at equal intervals along the length direction of the telescopic rod;

wherein one end of the plurality of limiting rods is fixed on the telescopic rod, the other end of the plurality of limiting rods passes through corresponding limiting slot, and the limiting rods are driven by the telescopic rod to slide in the limiting slots to press or release the wafers placed in the carrier slots.

3. The flipping apparatus according to claim 2, wherein the clamping apparatus further includes a liquid discharge chamber for collecting and discharging liquid accumulated inside the housing.

4. The flipping apparatus according to claim 2, wherein the clamping apparatus is further provided with a displacement sensor for measuring the displacement of the telescopic rod.

5. The flipping apparatus according to claim 2, wherein the partition plates of the bracket body set accommodating grooves for accommodating the limiting rods.

6. The flipping apparatus according to claim 1, wherein the bottom of the carrier slots of the bracket body set a plurality of liquid drain holes.

7. The flipping apparatus according to claim 1, further comprising:

a box body, wherein the box body is provided with a loading port.

8. The flipping apparatus according to claim 7, further comprising: an exhaust device disposed on a rear wall of the box body, wherein the exhaust device comprises a first exhaust plate, a second exhaust plate, a liquid collecting cavity and an exhaust port which are sequentially arranged along the air flow direction, the first exhaust plate is provided with a plurality of first air vents; the second exhaust plate is provided with a plurality of second air vents, a space is reserved between the first exhaust plate and the second exhaust plate, the first air vents and the second air vents are arranged in a staggered manner, and the exhaust port is configured to connect a fan.

9. The flipping apparatus according to claim 8, wherein both the second air vents and the exhaust port are arranged obliquely upward.

10. The flipping apparatus according to claim 8, wherein the first exhaust plat is arranged in an inclined manner relative to the second exhaust plate.

11. The flipping apparatus according to claim 8, wherein the bottom of the liquid collecting cavity is provided with a liquid discharge port.

12. The flipping apparatus according to claim 1, further comprising a lifting mechanism, wherein the lifting mechanism comprises a lifting rod and a support base fixed on the lifting rod, the support base is driven by the lifting rod to move up and down, and is used to assist the wafers to be transferred from a robot to the bracket body.

13. The flipping apparatus according to claim 1, further comprising a plurality of nozzles disposed around the bracket body for spraying liquid onto the wafer held in the bracket body.

* * * * *